United States Patent [19]

Steely

[11] Patent Number: 4,833,672
[45] Date of Patent: May 23, 1989

[54] MULTIPLEX SYSTEM

[75] Inventor: Lee W. Steely, Reinholds, Pa.

[73] Assignee: AMP Incorporated, Harrisburg, Pa.

[21] Appl. No.: 837,911

[22] Filed: Mar. 10, 1986

[51] Int. Cl.[4] .......................... H04L 1/20; H04L 5/22
[52] U.S. Cl. ................................ 370/85; 340/825.06; 340/365.5; 371/6; 341/24
[58] Field of Search ................... 370/96, 111, 29, 85, 370/77, 100; 340/365 E, 365 S, 825.06, 825.14; 371/6, 64

[56] References Cited

U.S. PATENT DOCUMENTS

| | | | |
|---|---|---|---|
| 3,480,910 | 11/1969 | Brenza et al. | 371/6 |
| 3,520,997 | 7/1970 | Kawashima et al. | 370/111 |
| 3,523,278 | 8/1970 | Hinkel | 371/6 |
| 3,601,806 | 8/1971 | Heimbigner . | |
| 3,660,599 | 5/1972 | Wiedmann | 178/6 |
| 3,967,059 | 6/1976 | Moore, III et al. | 370/31 |
| 3,973,256 | 8/1976 | Stoesser et al. | 340/365 E |
| 4,097,692 | 6/1978 | Felix | 370/85 |
| 4,220,822 | 9/1980 | Kawai et al. | 370/85 |
| 4,345,325 | 8/1982 | Gandini | 370/29 |
| 4,419,752 | 12/1983 | Sonnenberger et al. | 370/29 |
| 4,508,399 | 4/1985 | Dowling et al. . | |
| 4,617,554 | 10/1986 | Krause et al. | 340/365 E |
| 4,779,264 | 10/1988 | Glover | 370/85 |

FOREIGN PATENT DOCUMENTS

| | | | |
|---|---|---|---|
| 0162231 | 11/1985 | European Pat. Off. . | |
| 0016945 | 2/1979 | Japan | 370/29 |

OTHER PUBLICATIONS

Powers, M. J., "The WD2123-A New Generation UART", Electronic Engineering, Oct. 1981, vol. 53, No. 658, pp. 55–58.

"Remote Keyboard Interface" by M. D. Alger and B. Benson of Wireless World, vol. 87, No. 1545, Jun. 1981, pp. 77–78, Sheepen Place, Colchester, England.

Primary Examiner—Douglas W. Olms
Assistant Examiner—Melvin Marcelo

[57] ABSTRACT

A multiplex system includes a master controller and a plurality of remote stations which are connected together by a cable. The cable is a twin co-ax cable which includes data and clock conductors which are surrounded by power and ground conductors. The power and ground conductors are capacitively coupled such that the power conductor simultaneously transmits power and provides an effective shield. The master controller includes a microcomputer which in turn includes an UART. The UART is used to transmit command bits to the remote stations while the CPU reads response bits from the remote stations in order to allow response bits to be interleaved in time with command bits. In one embodiment, the command bits are used to strobe row conductors of a keyboard and the response bits are used to monitor column conductors of the keyboard to allow a keyboard to be controlled by the master controller 20 in a simple and efficient manner. In the preferred embodiment an integration counter is used to decode response signals such as those from a keyboard and the integration counter is incremented when the desired signal is obtained and decremented when it is not. In this way the state of the signal can be determined even in an extremely noisy environment.

19 Claims, 12 Drawing Sheets

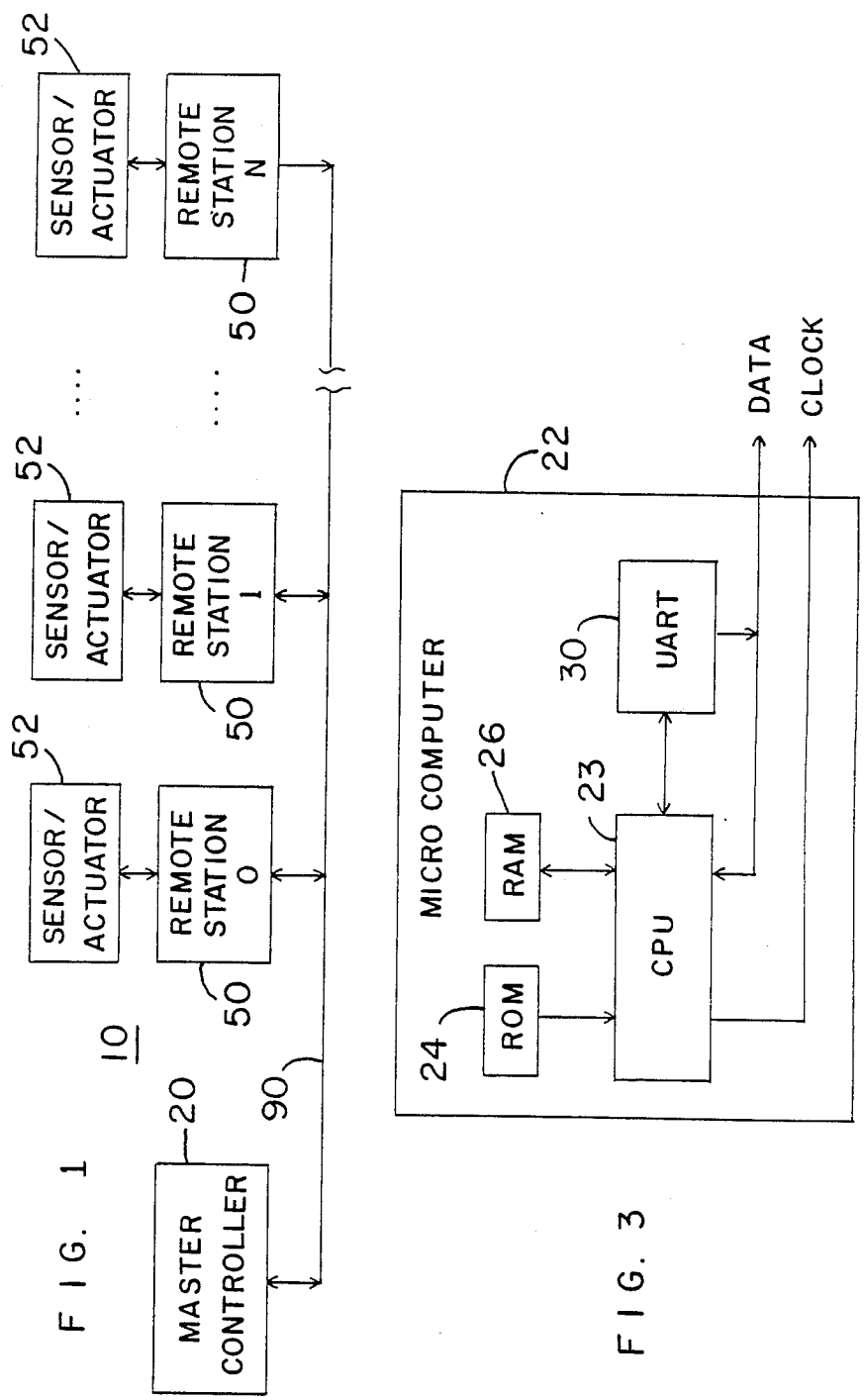

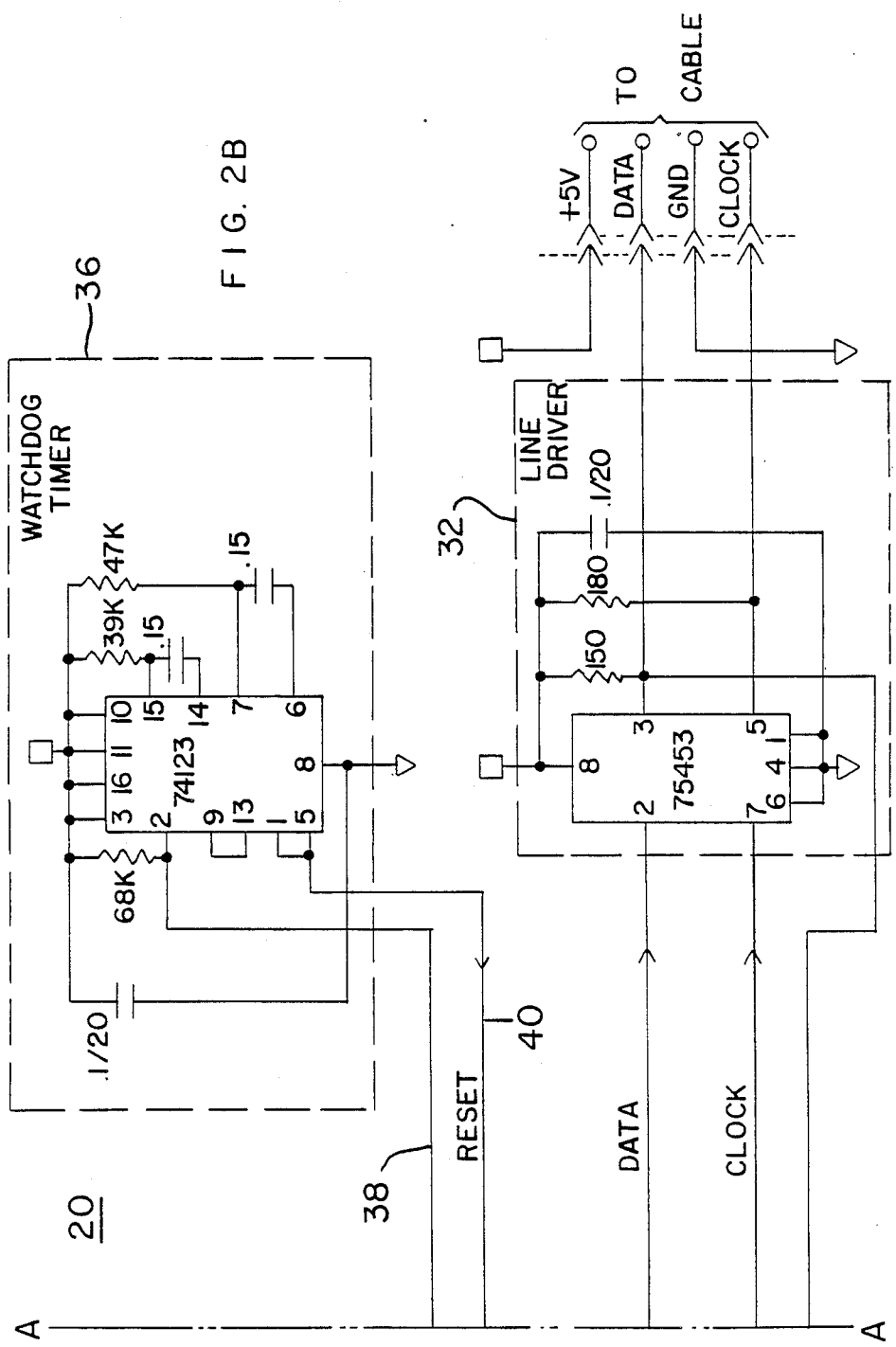

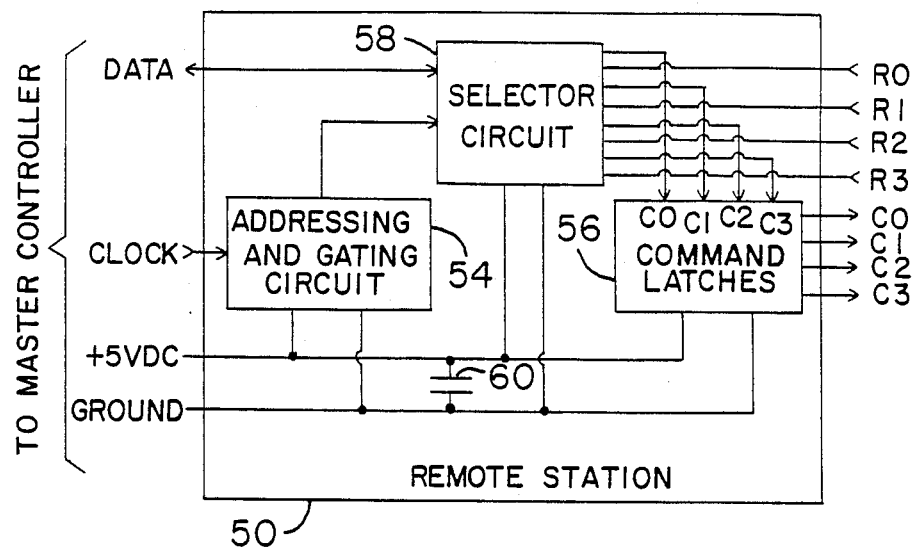
F I G. 4
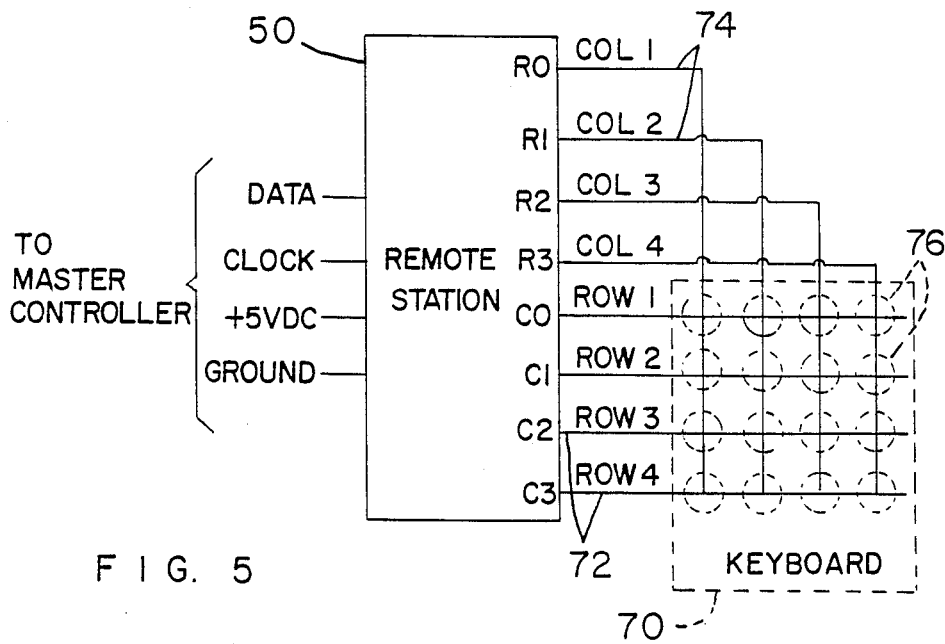
F I G. 5

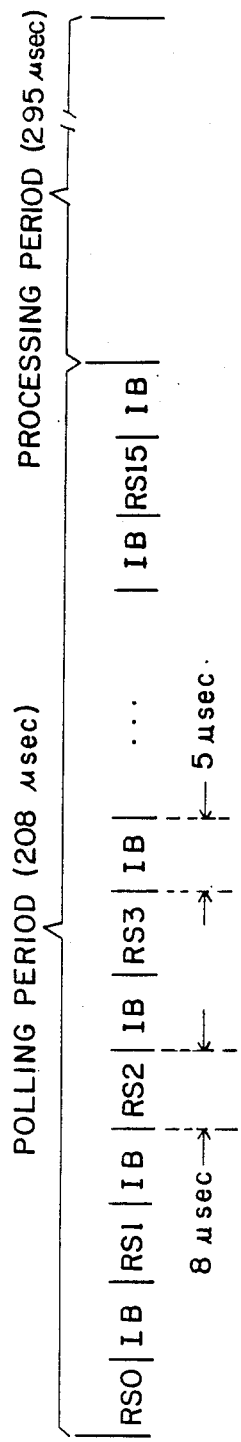
FIG. 8
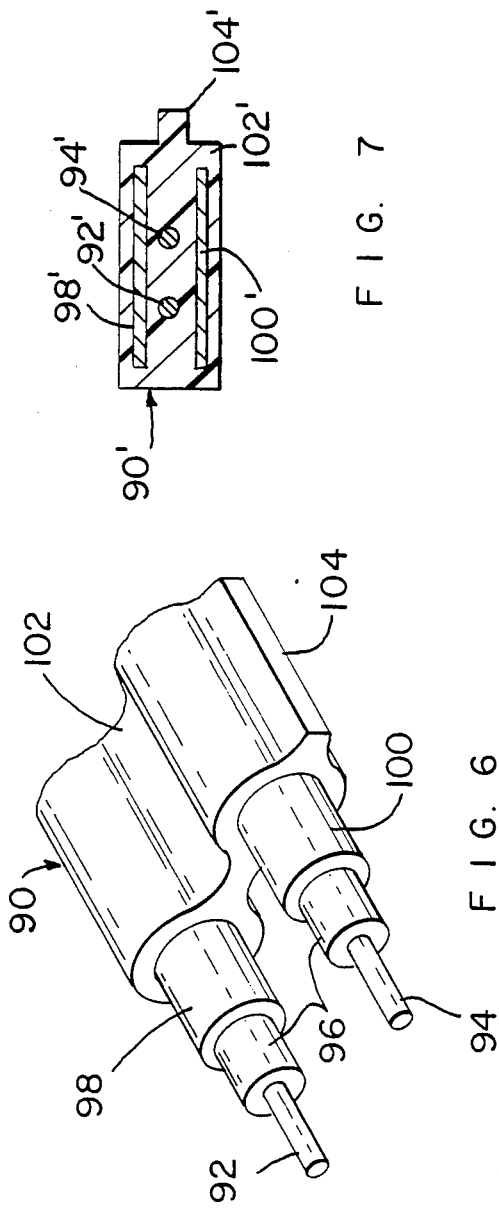
FIG. 7
FIG. 6

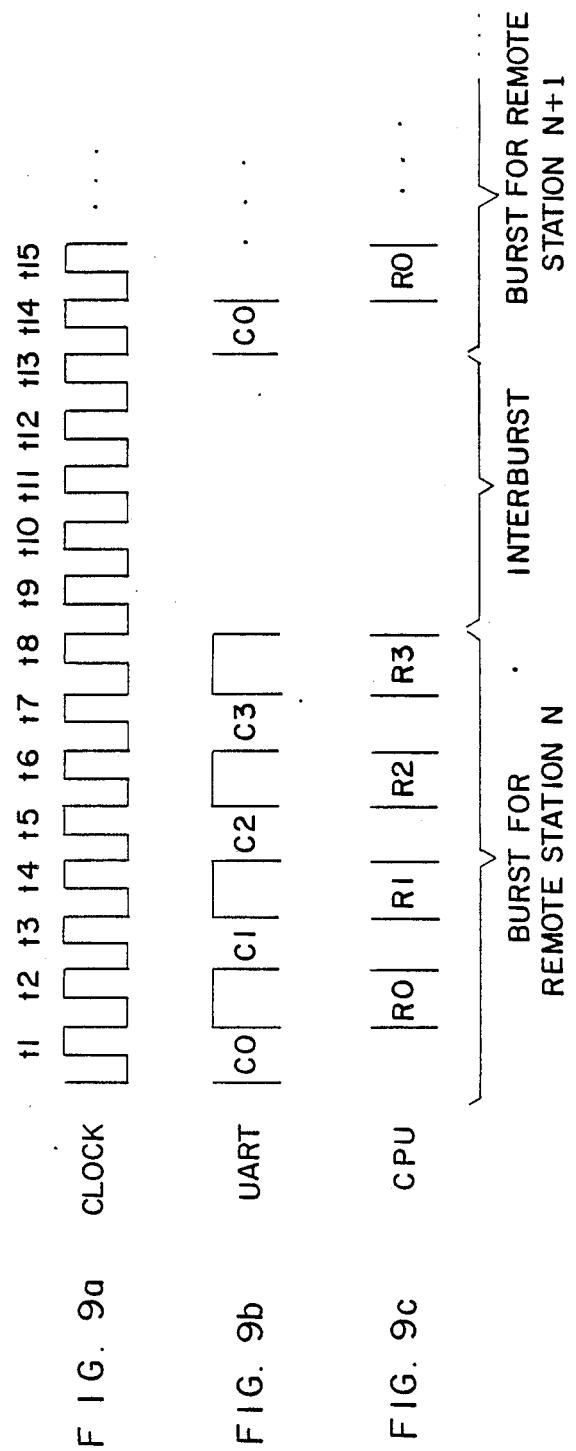

MULTIPLEX SYSTEM

BACKGROUND OF THE INVENTION

The present invention relates to improvements to multiplex systems of the type comprising a master controller which is linked to a plurality of remote stations and in which data signals are interchanged between the master controller and the remote stations.

Multiplex systems have been used in a variety of applications to reduce the number of conductors required to interconnect a master controller with remote actuators or sensors. In such multiplex systems, commands from the master controller are sent to the remote stations and measured quantities are sent as response signals from the remote stations to the master controller. In order for a multiplex system to compete effectively with simpler approaches such as direct connection systems using dedicated cables between the controller and each of the remote sensors or actuators, it is important that the multiplex system operate reliably, even in a noisy environment. It is also important that the multiplex system minimize the cost and complexity of the master controller and of the portions of the remote stations needed to adapt the remote stations to particular sensors or actuators.

SUMMARY OF THE INVENTION

The present invention is directed to improvements to multiplex sensors which allow command signals to be interleaved in time with response signals at a high data transmission rate in an efficient and reliable manner, which efficiently interface the multiplex system with a keyboard, and which reliably decode response signals even in a noisy environment.

According to a first feature of this invention, a multiplex system of the type which comprises a master controller and a plurality of remote stations is provided. Each remote station comprises means for transmitting a plurality of data bits to the controller and means for receiving a plurality of data bits from the controller. According to this first feature of the invention, a microcomputer is included in the controller, and this microcomputer comprises a CPU and an interface buffer, such as a UART for example. First means included in the interface buffer operate to pass a plurality of first sets of data bits, each of which is passed between the microcomputer and a respective one of the remote stations. This first means operates independently of the CPU during the passing of each of the first sets of data bits. Second means are provided in the microcomputer for sequentially passing a respective second set of data bits between the microcomputer and each of the remote stations. Each of the first sets of data bits comprises a respective plurality of first data bits and each of the second sets of data bits comprises a respective plurality of second data bits. The first and second data bits alternate in time such that the first and second means operate simultaneously.

In the preferred embodiment described below the first means is embodied as a UART which transmits command bits to the remote stations via a data conductor, while the CPU monitors the data conductor to receive response bits from the remote stations. Each pair of adjacent command bits is separated by a spacer bit, such that operation of the UART does not interfere with reception of the response bits. The command bits and response bits are interleaved on the data conductor on a bit-by-bit basis.

This first feature of the invention provides the important advantage that readily available hardware can be used to interleave command bits and response bits on a bit-by-bit basis at a high data transmission rate. Because the CPU receives the response bits while the UART is transmitting a previously loaded set of command bits, it appears that the CPU and UART are operating independently and simultaneously to provide both transmission of command bits and reception of response bits simultaneously.

According to a second feature of this invention, a multiplex system is provided which comprises a master controller and a plurality of remote stations. Means are provided for transmitting command bytes from the controller to the remote stations, each command byte comprising a plurality of command bits. Means are provided for transmitting response bytes from the remote stations to the controller, each response byte comprising a plurality of response bits. A keyboard having a plurality of row conductors, a plurality of column conductors and an array of switches, each placed to interconnect a respective row conductor with a respective column conductor is coupled to a first remote station. Means are included in the first remote station for applying a plurality of signal patterns to the row conductors, such signal patterns determined by a first set of command bytes received by the first remote station. Means are also included in the first remote station for generating a first set of response bytes such that each of the response bytes in the first set of response bytes indicates a signal pattern on the column conductors at a respective time. Means are provided in the master controller for generating the first set of command bytes such that the signal patterns applied to the row conductors scan the row conductors sequentially.

This second feature of the invention provides an extremely simple, reliable, and inexpensive means for driving a keyboard with a multiplex system of the claimed type. In the preferred embodiment described below no alteration of any type is required to the remote stations, and the master controller can readily be programmed to scan the row conductors and monitor the column conductors in order to detect actuation of switches of the keyboard.

According to a third feature of this invention, a multiplex system of the type comprising a master controller which monitors a repeatedly polled response signal generated by a remote station is provided with means for maintaining a count. Means are also provided for automatically incrementing the count each time the polled response signal is in a first state, and for automatically decrementing the count each time the polled response signal is in a second state. Means are also provided for determining when the polled response signal is in a selected one of the first and second states by comparing the count with a threshold value and indicating when the count passes the threshold value.

This third feature of the invention provides important advantages in terms of reliable operation of the multiplex system even in an extremely noisy environment. In the event that communication between the master controller and the remote station is interrupted on an intermittent basis, the repeatedly polled response signal would appear and disappear on an erratic basis. This aspect of the invention allows such an erratic response signal to be decoded in a reliable manner by integrating the response signal over time. With this approach, the presence of the response signal can be determined reliably, even when the signal to noise ratio is close to one to one. Furthermore, this aspect of the invention allows the state of the response signal to be determined reliably in a rapid manner. If, as in some prior art systems, a count were maintained and the count were reset each time the response signal disappeared, the count would take an excessively long time to reach the threshold in a noisy environment. In the embodiment described in detail below, this aspect of the invention is used in conjunction with a keyboard to detect actuation of keys reliably. Of course, this aspect of the invention can readily be adapted for use with other types of repeatedly polled response signals.

The invention itself, together with further objects and attendant advantages, will best be understood by reference to the following detailed description, taken in conjunction with the accompanying drawings.

BRIEF DESCRIPTION OF THE DRAWINGS

FIG. 1 is a schematic representation of a presently preferred embodiment of the multiplex system of this invention.

FIGS. 2a and 2b are an electrical schematic diagram of the master controller included in the multiplex system of FIG. 1.

FIG. 3 is a schematic representation of internal components of the microcomputer included in the master controller of FIG. 2.

FIG. 4 is a schematic representation of one of the remote stations included in the multiplex system of FIG. 1.

FIG. 5 is a schematic representation of one of the remote stations of FIG. 1 coupled to a keyboard.

FIG. 6 is a perspective view in partial cut away of a cable included in the multiplex system of FIG. 1.

FIG. 7 is a cross-sectional representation of an alternative form of the cable of FIG. 6.

FIG. 8 is a timing diagram for the multiplex system of FIG. 1.

FIGS. 9a, 9b and 9c are timing diagrams for the multiplex system of FIG. 1.

DETAILED DESCRIPTION OF THE PRESENTLY PREFERRED EMBODIMENTS

Figure 2A:
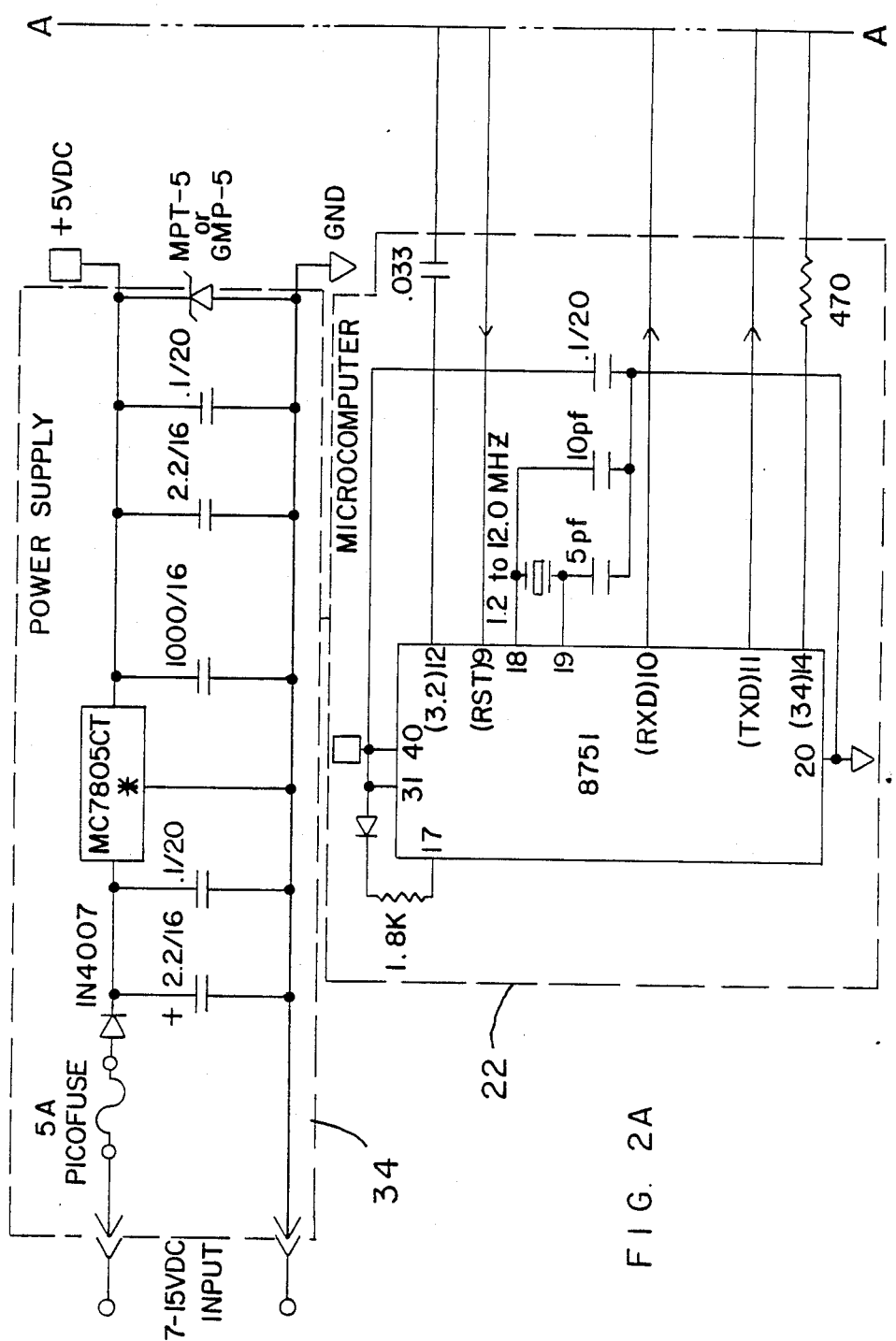

Turning now to the drawings, FIG. 1 shows a schematic representation of a multiplex system 10 which incorporates a presently preferred embodiment of this invention. This multiplex system 10 includes a master controller 20 which is coupled to a number of remote stations 50 by a cable 90. Each of the remote stations 50 is in turn coupled to a respective sensor/actuator 52. The master controller 20 directs command signals to remote stations 50, which in turn latch these command signals and apply the command signals to the associated sensor/actuator 52 in order to control the sensor/actuator 52. In addition, the master controller 20 polls the remote stations 50 for response signals supplied to the remote stations 50 by the sensor/actuators 52. The sensor/actuators 52 can take a wide variety of forms, and can include, for example, solenoids or switches to be controlled by the master controller 20 or sensors or switches such as keyboards, proximity switches or the like.

FIGS. 2a and 2b show an electrical schematic diagram of the master controller 20 of FIG. 1. As shown in FIGS. 2a and 2b, the master controller 20 includes a microcomputer 22, a power supply 34, a watch dog timer 36, and a line driver 32. The power supply 34 supplies +5 VDC and 0 VDC voltages to circuits of the master controller 20 and via the cable 90 to the remote stations 50. The microcomputer 22 in this preferred embodiment is implemented as an Intel 8751 integrated circuit coupled to a 12 MHz crystal. The microcomputer 22 is coupled via the line driver 32 to the cable 90. As explained in greater detail below, the microcomputer 22 generates a periodic, square wave clock signal on a clock conductor 92 included in the cable 90, which is used to synchronize the operation of the remote stations 50. In addition, the microcomputer 22 transmits command signals to the remote stations 50 and monitors response signals from the remote stations 50 via a data conductor 94 included in the cable 90.

The watch dog timer 36 is connected to the microcomputer 22 by conductors 38, 40. The microcomputer 38 is programmed to issue a pulse on the conductor 38 at least once every millisecond. The watch dog timer 36 monitors the pulses on the line 38. In the event the microcomputer 22 fails to issue a pulse on line 38 for a selected time period (slightly greater than one millisecond in this embodiment), the watch dog timer 36 generates a reset pulse on line 40 which resets the microcomputer 22. Each of the components of the master controller 20 is a standard, readily obtainable component. For this reason, these components will not be described here in greater detail.

FIG. 3 shows a schematic representation of the microcomputer 22. As shown in FIG. 3, the microcomputer 22 includes a Central Processing Unit or CPU 23 which is coupled to both a read-only memory 24 and a random access memory 26. In the conventional manner the read-only memory 24 stores the program to be executed by the CPU 23 and the random access memory 26 is used by the CPU 23 for the storage of variables. The microcomputer 22 includes an on board interface buffer 30 commonly known in the art as a UART. The UART is coupled both to the CPU 23 and to the data conductor on the cable 90. As explained below in greater detail, the UART can be used to transmit command bits on the data conductor. Briefly, when the CPU 23 loads an 8-bit byte into the UART 30, the UART 30 is started. Once the UART 30 is started, the UART 30 outputs the previously loaded 8 bit byte onto the data conductor, without further supervision or control by the CPU 23.

As shown in FIG. 4, each of the remote stations 50 includes three basic subcircuits: an addressing and gating circuit 54, a set of four command latches 56, and a selector circuit 58. The selector circuit 58 is coupled to the data conductor of the cable 90, and the addressing and gating circuit 54 is coupled to the clock conductor of the cable 90. The addressing and gating circuit 54 counts pulses on the clock conductor, and at a predetermined count enables the selector 58. For the next eight periods of the clock signal on the clock conductor the selector circuit 58 sequentially interconnects the data conductor on the cable 90 with the response inputs R0–R3 and the command latches for the command outputs C0–C3. The selector circuit 58 is arranged such that the response signals alternate with the command signals on the data conductor. In this embodiment, the data conductor is connected with the response inputs and the command outputs in the following sequence:

C0, R0, C1, R1, C2, R2, C3, R3. The detailed circuitry of the remote station 50 is described and illustrated in FIG. 3 of co-pending U.S. patent application Ser. No. 06/567,476, filed Jan. 3, 1984, entitled "A Time-Slot Addressed, System Keyed Multiplex Device," which is assigned to the assignee of this invention. The specification of this application is hereby incorporated by reference in the present specification for its teaching of the detailed circuitry of the remote station 50.

As shown in FIG. 4, each of the remote stations 50 includes a capacitor 60 interconnecting the +5 VDC and the ground inputs. As explained below, this capacitive coupling between the two power conductors of the cable 90 is provided to improve noise immunity and reduce RFI and EMI emissions associated with the high frequency signals on the data and clock conductors. Preferably, the capacitor 60 is 0.1 microfarads, and a capacitor is provided across the ground and +5 VDC conductors at least every twenty feet along the length of the cable 90 in this embodiment. In the event the remote stations 50 are spaced at greater intervals than twenty feet, separate capacitors are preferably used to provide the desired capacitive filtering.

FIG. 5 is a schematic representation which shows the manner in which one of the remote stations 50 is connected with a keyboard 70. As shown in FIG. 5, the keyboard 70 includes four row conductors 72 and four column conductors 74. A respective switch 76 is provided at each node in the grid defined by the row conductors 72 and the column conductors 74. Each switch 76 is coupled to a touch pad and is normally open in this embodiment such that the row conductors are isolated from the column conductors when the switches 76 are in their rest state. A row conductor 72 can be shorted to a selected one of the column conductors 74 by depressing the appropriate switch 76. Any suitable keyboard 70 can be used; for example the keyboards sold by AMP Incorporated as AMP Part Nos. 923792 and 923515 have been found to be suitable. Of course, the number of row and column conductors may be altered as necessary for the intended application.

As shown in FIG. 5, each of the row conductors 72 is connected to a respective one of the command outputs C0–C3, and each of the column conductors 74 is connected to a respective one of the response inputs R0–R3. Thus, the master controller 20 can apply any desired signal pattern on the row conductors 72 and then monitor the column conductors 74 to determine which of the switches 76 have been activated. As explained in greater detail below, the keyboard 70 is scanned by sequentially placing the following signal patterns on the row conductors 72: 0111, 1011, 1101, 1110, where "1" indicates +5 VDC and "0" indicates 0 VDC. In this specification and the following claims, the terms "row conductor" and "row" are used to designate the conductors which are scanned, and can be oriented horizontally or vertically. Similarly, the terms "column conductor" and "column" are used to designate the conductors which are sensed.

FIG. 6 shows a perspective view in partial cut away of a presently preferred embodiment of the cable 90. The cable 90 includes two co-axial cables. These co-axial cables include center conductors 92, 94 which are preferably the clock and data conductors, respectively. Each of the conductors 92, 94 is surrounded by a low loss insulator 96, which is in turn surrounded by a respective sheath conductor 98, 100. Preferably, the sheath conductors 98, 100 are connected to the +5 VDC and ground terminals of the master controller 20, respectively. The sheath conductors 98, 100 are imbeded in an extruded insulator 102. The insulator 102 defines a key 104 at one edge to indicate the polarity of the cable 90.

Preferably, the clock and data conductors 92, 94 are about 14 AWG and the power and ground conductors 98, 100 are co-axial braids having a relatively large cross section (about 12 AWG). The ground conductor 100 is grounded by the master controller 20 and thus provides an excellent shield for the data conductor 94. Because the power conductor 98 is capacitively coupled to the ground conductor 100 by the capacitors 60, the power conductor 98 also provides an excellent shield. The dielectric between the inner conductors 92, 94 and the sheath conductors 98, 100 is preferably a low loss, low dielectric constant material such as polyethylene. The outer insulator 102 should be chosen for mechanical, cost, and environmental factors. In many applications PVC is well suited for use as the outer insulator 102.

As pointed out above, high frequency square wave signals are transmitted on the clock and data conductors 92, 94, and the sheath conductors 98, 100 in this embodiment serve three important functions: (1) they transmit power to the remote stations 50; (2) they shield the clock and data conductors 92, 94 from noise; and (3) they prevent excessive EMI and RFI interference from being broadcast by the clock and data conductors 92, 94. The remote stations 50 can be interconnected with the cable 90 by the use of conventional connectors such as the low profile co-ax taps marketed by AMP Incorporated as AMP Part No. 228752-1.

FIG. 7 shows a cross-sectional view of an alternate embodiment 90' of the cable 90. In the embodiment of FIG. 7 the clock and data conductors 92', 94' are positioned between spaced, parallel power and ground conductors 98', 100'. The entire assembly is surrounded by an insulator 102' which includes a key 104' to indicate polarity. In the cable 90' the power and ground conductors 98', 100' substantially surround the clock and data conductors 92', 94', thereby providing excellent shielding in a manner similar to that of the sheath conductors 98, 100. Of course, in other embodiments other geometries can be used in which the power and ground conductors substantially surround the data and clock conductors to provide the shielding advantages described above.

Table 1 provides an index of Appendices 1–5 included with this specification. Each Appendix includes a source and object code listing of a respective routine included in the program executed by the master controller 20. Appendices 1 and 2 provide the listing for the main executive, and are provided to define the environment in which the programs of Appendices 3–5 operate. For this reason, the routines of Appendices 1 and 2 will not be discussed in detail. Here, it is enough to note that the routines of Appendices 1 and 2 define the repetitive cycle shown diagrammatically in FIG. 8.

TABLE 1

| Appendix Number | Routine Name | Routine Function |
|---|---|---|
| 1 | TSMEB2 | Main Executive (Part 1) |
| 2 | TSMEP1 | Main Executive (Part 2) |
| 3 | TSTRN0 | Remote Station Polling Routine |
| 4 | TSSRK1 | Keypad Service Routine |
| 5 | TSDK10 | Decode Keypad Routine |

FIG. 8 the symbols RS0, RS1, ... RS15 are used to designate burst periods during which the master controller 20 communicates with remote stations 0, 1, ... 15, respectively. For example, during the burst period RS0 the master controller 20 transmits four command bits C0–C4 to remote station 0 and receives four response bits R0–R3 from remote station 0 via the data conductor 94. In FIG. 8 the symbol IB is used to designate an interburst period, which in this embodiment is five microseconds in duration. An interburst period is interposed between each adjacent pair of burst periods for consecutively addressed remote stations.

As shown in FIG. 8 the period of each complete cycle of the program executed by the master controller 20 is in this embodiment 503 microseconds. During the initial 208 microseconds, four command bits and four response bits are exchanged between each of the remote stations 50 and the master controller 20. During this initial period the master controller 20 merely stores the response bits received from the remote stations 50 for later processing. The second portion of the cycle is a processing period, which lasts for 295 microseconds in this embodiment. During the processing period the master controller 20 processes the response bits received from the remote stations 50 and determines the command bits to be sent to the remote stations 50 during the next cycle. This cycle is repeated continuously during operation of the master controller 20.

Appendix 3 provides a listing for TSTRNO, the routine executed during the polling period of FIG. 8. This routine utilizes the UART 30 to transmit the response bits R0–R3 and utilizes the CPU 23 to read the command bits C0–C3. FIGS. 9a through 9c illustrate the timing of a burst and interburst period. As shown in FIG. 9a, the clock signal on the clock conductor 92 of the cable 90 is a square wave, which in this preferred embodiment has a frequency of 1 MHz. For purposes of discussion, consecutive periods of the clock signal of FIG. 9a are labeled t1–t15. The clock signal defines a sequence of time slots for the remote stations 50.

As shown in FIGS. 9b and 9c, the UART 30 transmits a command byte which comprises command bits C0, C1, C2, C3 during time slots t1, t3, t5, and t7. The command byte also includes spacer bits in which the data line is driven to the logic high state. One of these spacer bits follows each of the command bits C0–C3 in time slots t2, t4, t6, t8. Simultaneously with the transmission of C0–C3 by the UART 30, the CPU 23 reads response bits R0–R3 during time slots t2, t4, t6 and t8, respectively. Because the UART 30 drives the data line 94 high during time slots t2, t4, t6 and t8, operation of the UART 30 does not interfere with transmission of the response bits R0–R3 by the remote stations 50. After an interburst period t9–t13 the foregoing sequence is repeated for the next remote station in sequence.

Figure 10A:
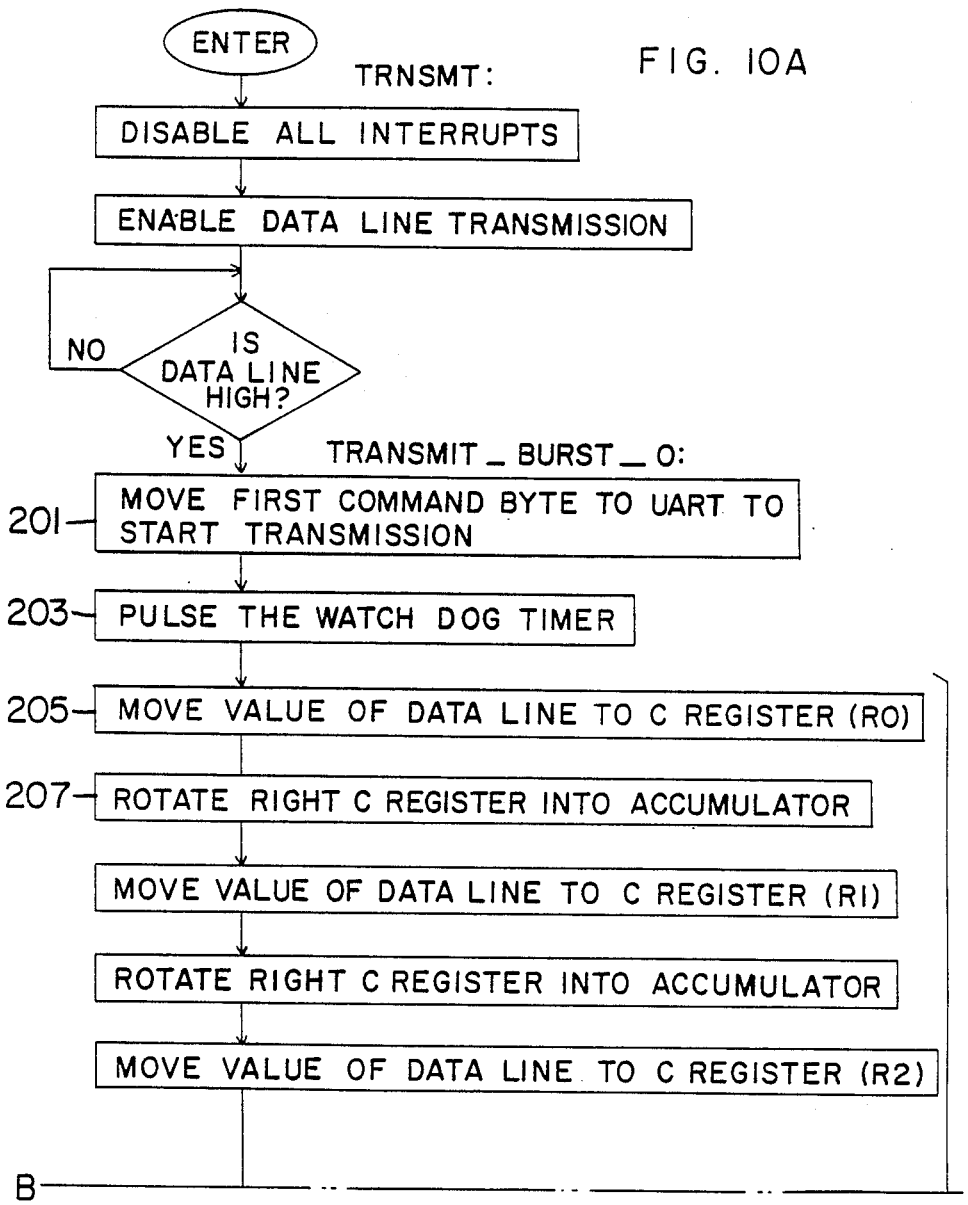
FIGS. 10a,b, 11a,b and 12a,b are flow charts of software routines executed by the microcomputer of the master controller of FIGS. 2 and 3.
Figure 10B:
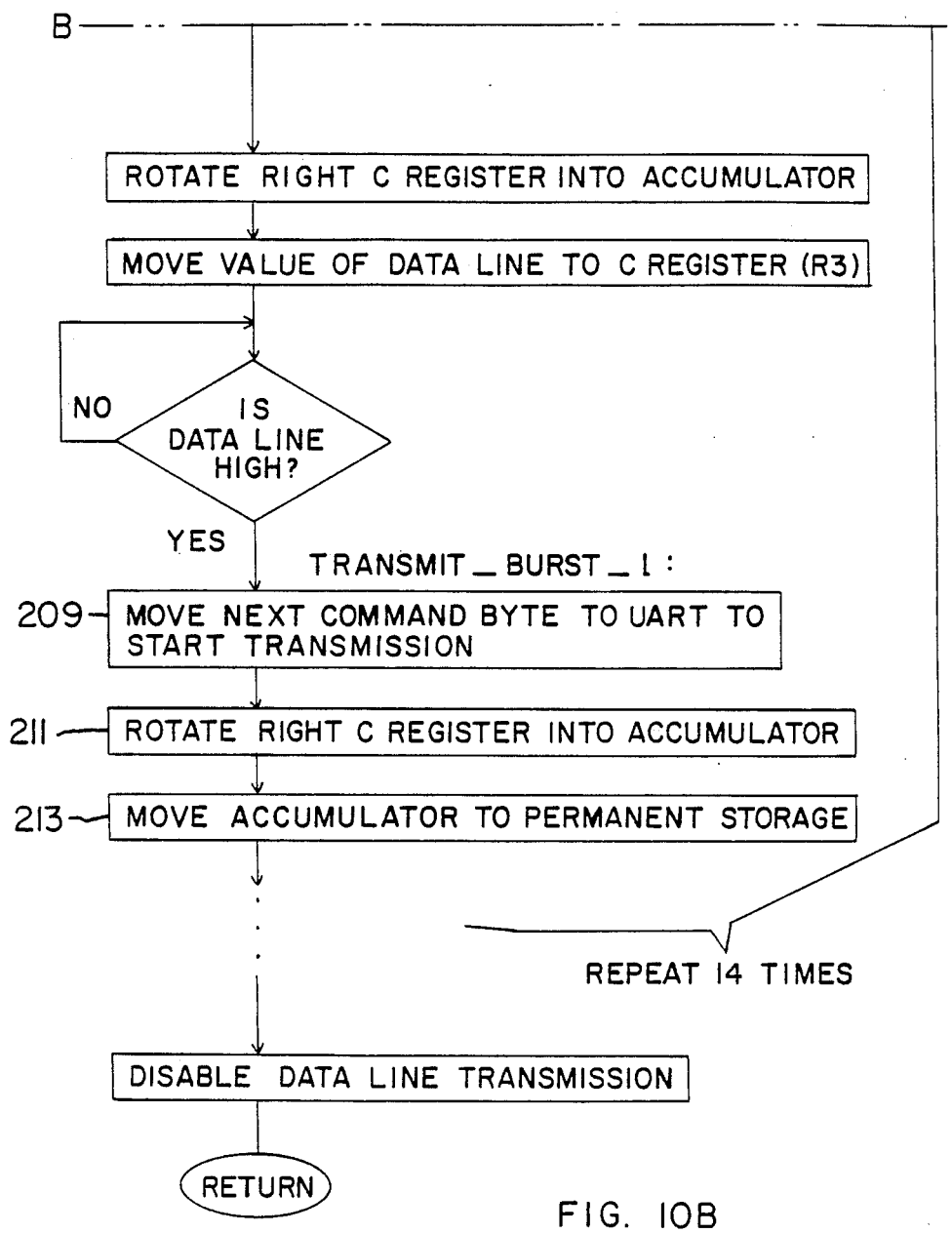

FIGS. 10a and 10b are a flow chart of the transmit routine of Appendix 3. As shown in FIGS. 10a and 10b, this routine first disables all interrupts. Timing is critical during the polling period, and interrupts could cause the CPU 23 to lose syncronization with the UART 30. The line driver 32 is then enabled and the routine checks that the data line 94 is high. If not (indicating a failure in the data line), the routine locks up at this point until the watch dog timer 36 resets the microcomputer 22. Assuming the data line 94 is high, the routine then transmits Burst 0 through Burst 15 in strict sequence. In order to obtain the desired timing, loops have been avoided and for this reason the programming is quite redundant. However, this approach provides the advantage of minimizing execution time and providing strict control over timing. Each of the Bursts 0–15 is addressed to a respective one of the 16 remote stations 50 of this embodiment.

As shown at block 201, the first step in transmitting Burst 0 is to move the first command byte to the UART 30. This initiates operation of the UART 30. As the UART 30 is transmitting the first command bit C0, the routine in FIG. 10 pulses the watch dog timer at block 203. By the time the watch dog timer has been pulsed, the UART 30 is transmitting the first spacer bit (during time slot t2 of FIG. 9a). During time slot t2 the routine of FIG. 10 reads the value from the data line 94 and transfers it to the C-register at block 205. During time slot t3, when the UART 30 is transmitting the second command bit C1, the routine of FIG. 10 rotates the C-register right into the accumulator at block 207. This pattern is repeated until all four command bits C0–C3 have been transmitted during time slots t1, t3, t5, and t7 and all four response bits R0–R3 have been read during time slots t2, t4, t6, t8. In each case the response bits R0–R3 are read by the CPU 23 during a time slot when the UART 30 is transmitting a spacer bit. In this way, the microcomputer 22 appears to be operating simultaneously to transmit the command bits C0–C3 and to read the response bits R0–R3.

After response bits R0–R3 for remote station 0 (Burst 0) have been received, the routine of FIG. 10 next checks to insure that the data line 94 is high. Then Burst 1 is transmitted to remote station 1, starting at block 209, by moving the second command byte to the UART 30, thereby initiating transmission of the second command byte. While the UART 30 is transmitting the first command bit C0 of the second command byte, the routine of FIG. 10 moves the last value for the data line for response byte 0 into the C-register at block 211 and then moves the accumulator to permanent storage at block 213. The routine of FIG. 10 then reads response bits R0–R3 in the manner described above. This process is repeated 14 times, thereby transmitting command bytes to and reading response bytes from each of the 16 remote stations 50. Of course, in alternate embodiments the number of remote stations 50 can be selected as desired for the particular application.

The routine of FIGS. 10a and 10b utilizes the UART 30 to interleave command bits and response bits on a bit-by-bit basis. This is achieved by utilizing the independent operation of the UART 30 to transmit the command bits while the CPU 23 attends to reading the response bits. Of course, response bits can be read by the UART 30 while command bits are transmitted by the CPU 23. Furthermore, in alternate embodiments the command bits and response bits may be transmitted on separate conductors rather than on the single data conductor 94 of the cable 90.

Figure 11A:
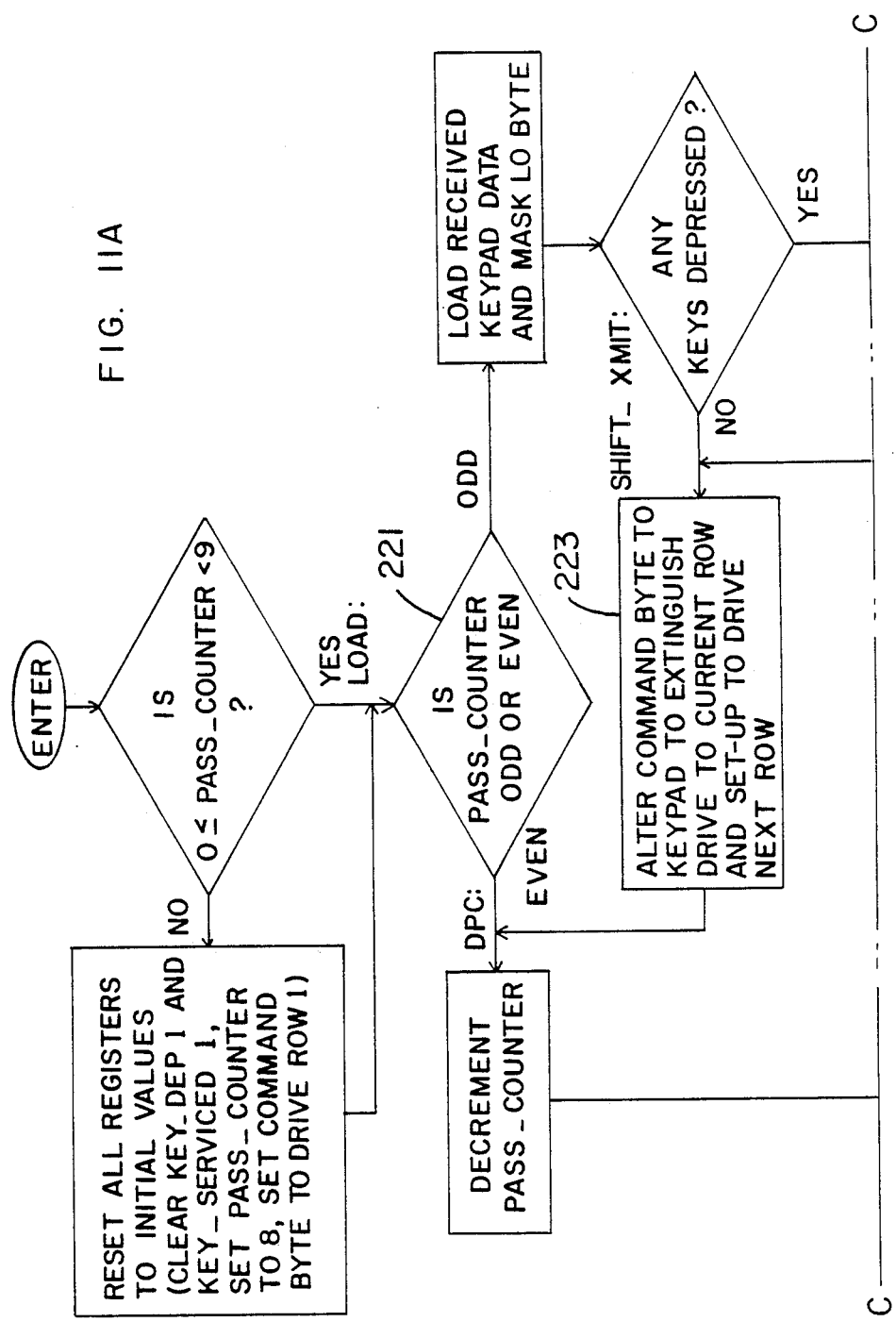
Figure 11B:
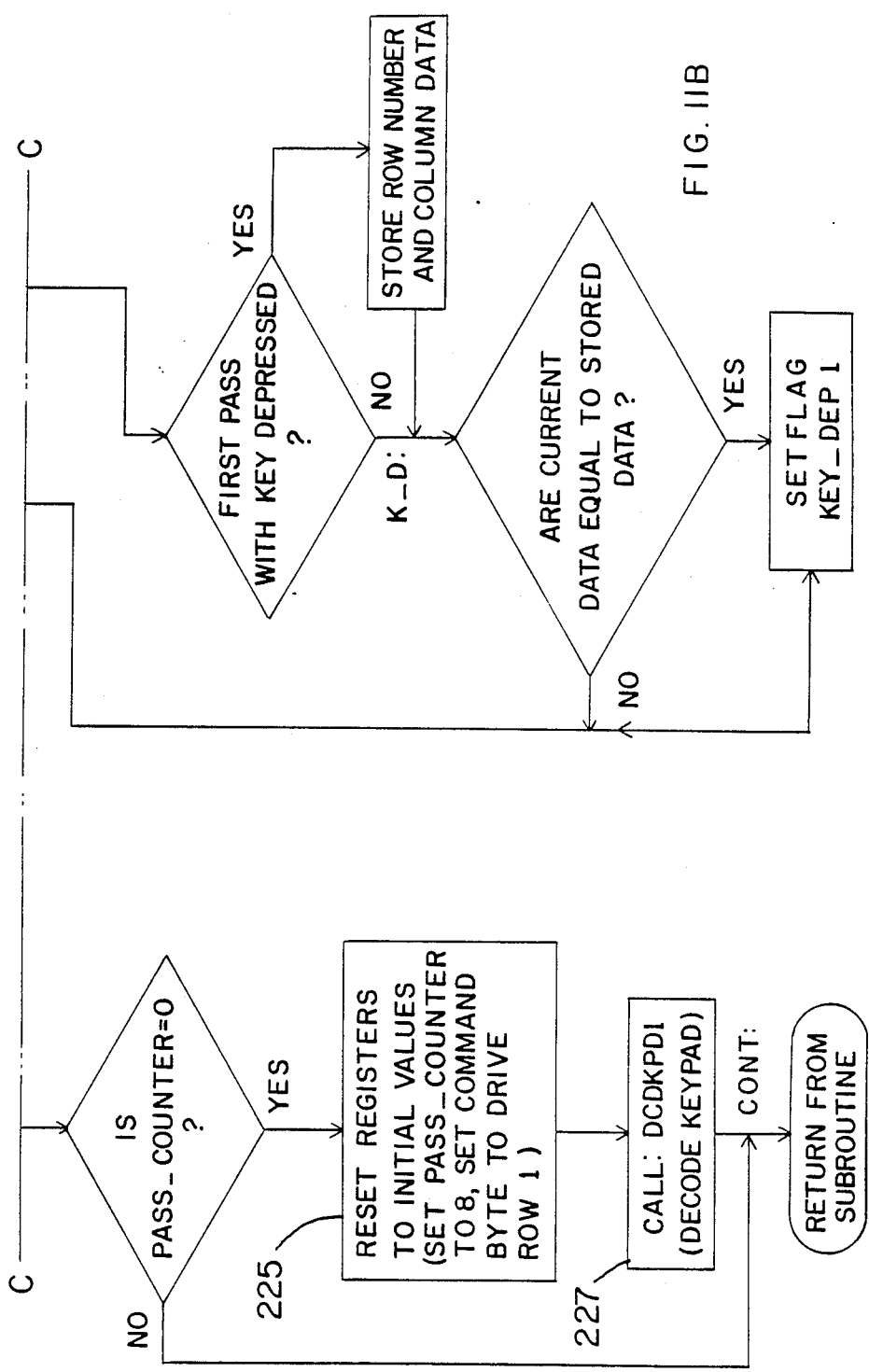

FIGS. 11a and 11b are a flow chart of the keypad service routine of Appendix 4. This routine scans the keyboard 70 in an eight period cycle. During the first period of the cycle Row 1 is grounded while Row 2–Row 4 are held high. During the second cycle columns one through four are read via response bits R0–R3 to determine if any of the switches on Row 1 are closed. Any closed switches will result in a logic low value in the associated response bit. In cycle three the command bits C0–C3 are reconfigured to ground Row 2 while maintaining Rows, 1, 3 and 4 in the logic high state. In cycle four, columns one through four are read to determine if any of the switches on Row 2 are closed. This process is continued until all four of the rows have been scanned. The cycle then repeats by again grounding Row 1.

The routine of FIGS. 11a and 11b is executed during the processing period. First the pass counter is checked to determine that it is greater than or equal to zero and less than nine. If not, the pass counter is set equal to eight, the command byte for the relevant remote station 50 is set to drive Row 1 to ground, and the flag KEY___DEP1 and KEY_SERVICED1 are cleared. The pass counter is then checked to determine if it is odd or even. In this embodiment an even value of the pass counter corresponds to a cycle when a new row is driven to ground, and an odd value of the pass counter corresponds to a cycle during which the logical state of the column conductors 74 is determined.

In the first pass of the routine of FIGS. 11a and 11b the command byte has been set to drive Row 1 to ground and the pass counter will be decremented and the subroutine will return. During the next processing period the pass counter will be found equal to the odd value 7 and the flow will branch to the right at decision block 221. The response bits R0–R3 from the remote station 50 connected to the keyboard 70 are then examined to see if any are in the logic low state. If no keys are found to have been depressed, the command byte for the relevant remote station 50 is altered to extinguish the drive to the current row and to drive the next row.

In the event any of the response bits R0–R3 is in the logic low state, the routine of FIGS. 11a and 11b checks to determine whether this is the first pass with a key depressed. If so, the row and column number of the depressed key are stored. The current row and column data are then checked for correspondence with this stored data. In the event of correspondence, the flag KEY_DEP1 is set. KEY_DEP1 is used as an indication that a key has been depressed and that on subsequent cycles it is the same key as in the previous cycle. In either event, the command byte is updated at block 223, and the pass counter is decremented and checked for equality with zero. As before, if the pass counter is not equal to zero the subroutine returns. This process continues until the pass counter is decremented to zero, at which time all four of the rows will have been scanned. The registers are then reset to initial values at block 225 and the decode keypad routine is called at block 227 prior to return.

From this description it should be clear that the multiplex system 10 is well suited for use with the keyboard 70 with an minimum of external hardware. The remote station 50 can be controlled to scan the consecutive rows of the keyboard 70 and to read the consecutive columns, without alteration or modification to the remote station 50. Because each cycle of the master controller 20 takes about 0.5 milliseconds in this embodiment, the entire keyboard 70 is scanned at a rate of about once every four milliseconds.

Figure 12A:
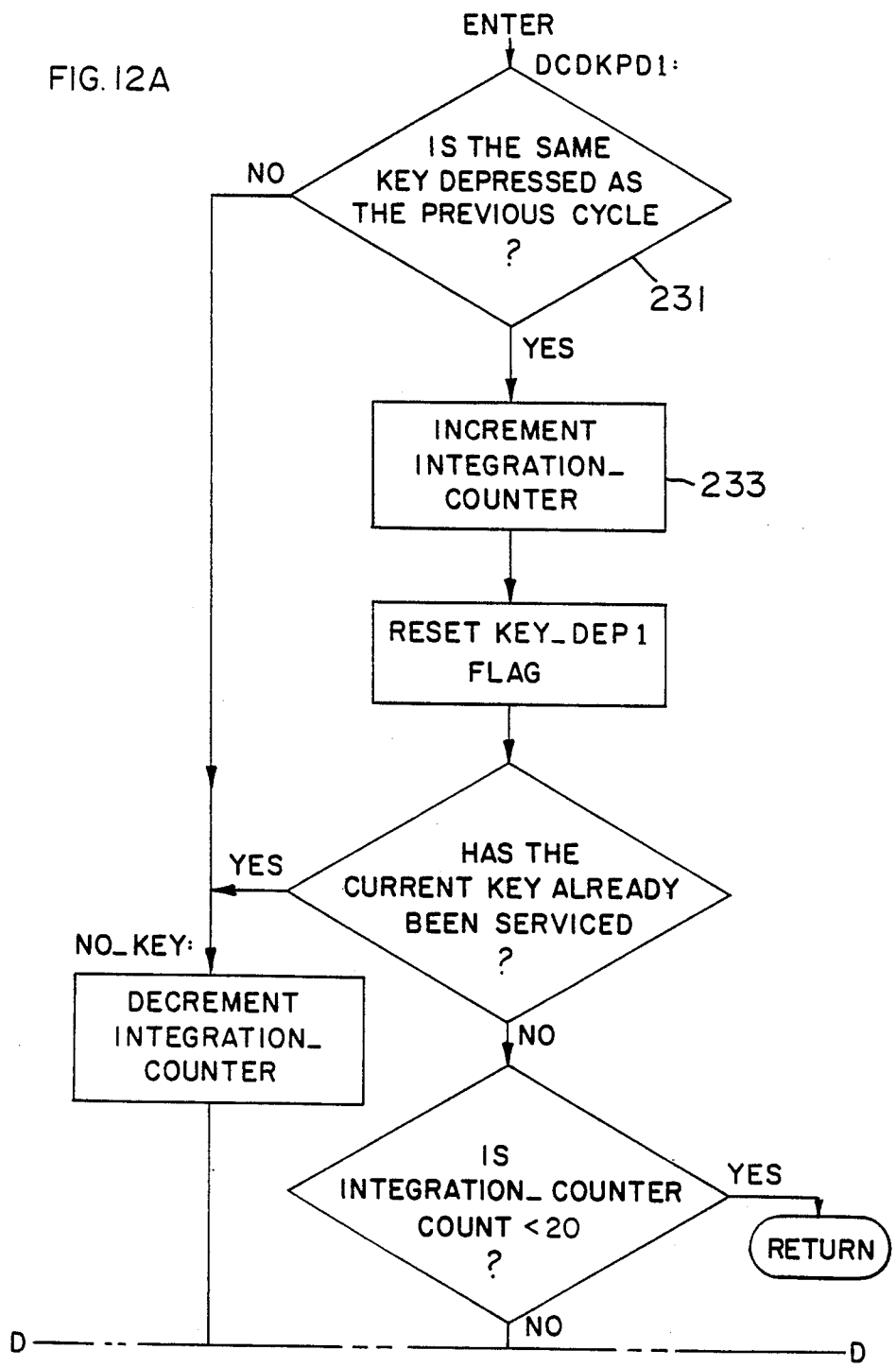
Figure 12B:
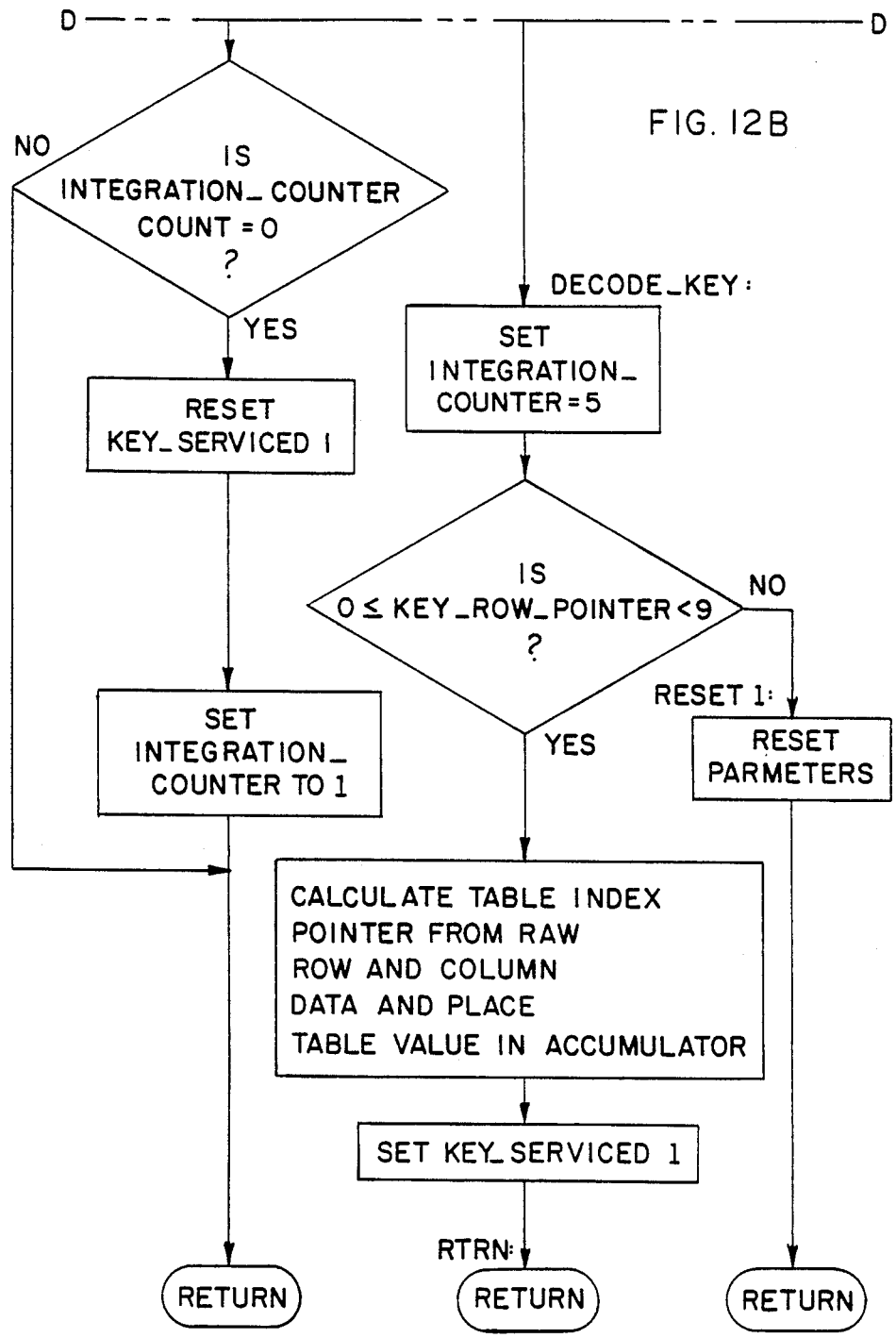

FIGS. 12a and 12b provide a flow chart of the decode keypad routine called by the service keypad routine of FIG. 11. The decode keypad routine of FIGS. 12a and 12b is listed in Appendix 5.

The decode keypad routine starts by checking the flag KEY_DEP1 to determine whether the same key is depressed this cycle as the previous cycle. If so, an integration counter is incremented at block 233 and KEY_DEP1 is reset. The routine then checks KEY_SERVICED1 to determine if the current key has already been serviced. If not, the integration counter is checked to determine if it is less than 20. If so, the routine returns; if not the integration counter is set equal to five and the key is decoded by calculating a table index pointer from the row and column data and placing the table value in the accumulator. The flag KEY_SERVICED1 is then set and the routine returns. In the event the initial decision of decision block 231 indicates that a new key has been depressed or in the event the current key has already been serviced, the integration counter is decremented and checked for equality with zero. If the integration counter is equal to zero the flag KEY_SERVICED1 is reset and the integration counter is set equal to one before the routine returns.

The decode keyboard routine of FIGS. 12a and 12b utilizes the integration counter to detect a change of state of the keyboard 70 reliably. While a single key of the keyboard 70 is held down, the integration counter is incremented until it reaches 20. It is only at this point that the key is decoded. If during the period while the key is being held down noise causes a response bit to be lost, the routine of FIG. 12 decrements the integration counter rather than resetting the count to zero. In effect, the integration counter is used to integrate the desired signal and noise interfering with reception of the desired signal. This approach allows the state of the keyboard to be determined reliably, even in the presence of high noise levels. Of course, the exact threshold used for the integration counter can be varied as desired to provide reliable decoding of the keyboard in the anticipated noise environment. Furthermore, in alternate embodiments it may be preferably to increment the counter in response to the signal by a value which differs from the amount of which the counter is decremented in response to absence to the signal. Of course, the term increment is used here in its broad sense, and is meant to include incrementing the counter by a negative number.

From the foregoing, it should be apparent that an improved multiplex system has been described which minimizes RF interference without unnecessarily increasing the number of conductors in the cable 90, which utilizes an independent interface buffer such as a UART to allow command bits and response bits to be interleaved in time at a high data transmission rate utilizing only a single microcomputer. Furthermore, a remarkably simple and efficient use of the multiplex system to control a keyboard has been described, along with an improved decoding approach which allows response signals such as keyboard actuation signals to be decoded reliably, even in a noisy environment.

Of course, it should be understood that a wide range of changes and modifications can be made to the preferred embodiments described above. It is therefore intended that the foregoing detailed description be regarded as illustrative rather than limiting, and that it be understood that it is the following claims, including all equivalents, which are intended to define the scope of this invention.

ISIS-II MCS-51 MACRO ASSEMBLER V2.0
OBJECT MODULE PLACED IN :F0:TSMEB2.OBJ
ASSEMBLER INVOKED BY: ASM51 TSMEB2.SRC XREF PW(108) TT(TSMEB2-) DA() DB EP WF(:F1:) PR(:F1:TSMEB2.LST)

```
LOC OBJ           LINE    SOURCE

1     $TT(TSMEB2-Task demo System Main Executive Begining V1.2) RB(0)
                    2     ;××××××××××××××××××××××××××××××××××××××××××××××××××××××××××××
                    3     ; ASSUMPTIONS: 1-One Response is to be reserved for the initiation of system
                    4     ;                 testing which will cycle every Command "ON" for 1/2 second.
                    5     ;              2-Upon every power-up or depression of the RESET switch, the
                    6     ;                 entire internal Data RAM of the 8051 is completely tested
                    7     ;                 with an alternating "1" and "0" pattern if any of the test
                    8     ;                 registers have been altered, otherwise they are not tested.
                    9     ;              3-Unless noted otherwise all TASK logic is negative true; i.e.
                   10     ;                 "0"=ON and "1"=OFF. This includes internal control flags.
                   11     ;              4-Unless noted otherwise all Intel control flags and bits are
                   12     ;                 positive true; i.e. "1"=ON and "0"=OFF.
                   13     ;              5-The hardware includes a "Watchdog Timer" to kick the micro-
                   14     ;                 computer back into sync in the event that an inadvertant
                   15     ;                 "glitch" vectors the computer into "Never-Never Land"!
                   16     ;              6-The Task Network (Clock and Data Lines) is directly driven
                   17     ;                 from the UART port through a 75453N Dual Peripheral "OR"
                   18     ;                 Driver chip.
                   19     ;              7-The system contains 15 "A" chips.
                   20     ;              8-System format is alternating commands and responses. Logic
                   21     ;                 is active low. The UART issues 16 data bursts of 8 bits each.
                   22     ;              9-Responses are stored in internal RAM at 30H to 3FH. Only the
                   23     ;                 high nibble of each byte contains desireable data. The most
                   24     ;                 significant bit(MSB-bit 7) of a given byte represents the 4th
                   25     ;                 response of a particular "A" chip and the 4th bit of a given
                   26     ;                 byte represents the 1st response of a particular "A" chip.
                   27     ;             10-All initializations are done in the COLD_START_INITIALIZATION
                   28     ;                 routine.
                   29     ;             11-The TASK Data Line is verified to be "1" prior to any
                   30     ;                 transmission of data. This results in an interburst dead time
                   31     ;                 of 5 usec with a 12.0 Mhz crystal.
                   32     ;             12-The Keypads are driven off "A" Chip #7 and #12. Row 1 to Row 4
                   33     ;                 is connected to C0 to C3 respectively and Column 1 to Column 4
                   34     ;                 of the keypad is connected to R0 to R3 respectively on the
                   35     ;                 "A" Chip. Data entry for the keypads when activated are stored
                   36     ;                 in Register Bank #1 and #2.
                   37     ;             13-Text Messages are inserted in the code from 100H to 1CFH.
                   38     ; LIMITATIONS: 1-No more than 16 "A" chips can be used with the technique in
                   39     ;                 this routine-this is the maximum capacity (however, a maximum
                   40     ;                 of 32 chips is permissible). Thus, responses fill the RAM area
                   41     ;                 from 30H to 3FH.
                   42     ; RESTRICTIONS: 1-All unused program memory area is to be filled with "02"
                   43     ;              2-This routine IS resricted to receiving a response to a
                   44     ;                 particular command immediately, i.e. on the current burst of
                   45     ;                 data. It is assumed that the system can respond immediately.
                   46     ;                 For example, if a command is issued and received at a
                   47     ;                 particular "A" chip, within 40 to 50 nSec the response is
                   48     ;                 driven and immediately read by the controller. Note that this
                   49     ;                 is not true for the Keypad scanning. The driving of one
                   50     ;                 particular row on a given "pass" of the system is NOT read
                   51     ;                 until the following "pass" of the system.
                   52     ; ACCURACY REQUIREMENTS: 1-Note the following times with a 12 Mhz crystal:
                   53     ;                 a)16 "A" chips: 13x16+295=503 usec-thus the system
```

```
LINE   SOURCE

54    ;                                       is executed 171.77 million times
 55    ;                                                per day!
 56    ;              b)The TASK Clock has a 1 Mhz Bit Rate                     V;SP;Bank 0
 57    ;                 2-Range of the Clock crystal is 1.2Mhz to 12.0 Mhz     < 2 Reg. 0,2,3,
 58    ; METHODS USED: 1-A 62.5 millisecond to 8 second timer is established with
 59    ;                 Timer0 and register P2. It is interrupt driven; however,
 60    ;                 the interrupt system is disabled during any Transmission
 61    ;                 via the UART. The interupt routine starts at code 0BH. Each
 62    ;                 entry to the routine reloads TL0 and TH0 and increments P2
 63    ;               2-The reset entry point at 00 vectors the program execution to
 64    ;                 202H where the test memory registers are checked.
 65    ; ALGORITHYM DEFINITIONS: None
 66    ; PRE-REQUISITES: NONE
 67    ; INPUTS:
 68    ;   -I/O: None
 69    ;   -REGISTERS; None
 70    ;   -MAILBOXES; 17H,19H,70H,7AH
 71    ;   -FLAGS; None
 72    ; OUTPUTS:
 73    ;   -I/O; P2
 74    ;   -REGISTERS; TL0,TH0
 75    ;   -MAILBOXES; 17H,19H,6DH,6EH,6FH,70H,7AH
 76    ;   -FLAGS; None
 77    ; REGISTERS USED: ACC
 78    ; MAXIMUM STACK DEPTH: 0 - not used
 79    ; SUBROUTINES CALLED: None
 80    ; BRANCHING: None
 81    ; TEST CRITERIA: Test all functional aspects of this module with the EMV51
 82    ;                 Emulation Vehicle.
 83    ; INTERMODULE COMMUNICATION: None
 84    ; ERROR EXITS: None
 85    ;
 86    ; MODULE LENGTH: 3+F+CFH+17=F9H BYTES (249 Dec);[0H to 218H-several holes]
 87    ; MODULE EXECUTION TIME:  CRYSTAL FREQ. ___12.00___MHZ                   ***************
 88    ;                         MINIMUM TIME; ___4.00___USEC
 89    ;                         MAXIMUM TIME; ___16.00___USEC
 90    ;                         INTERRUPT TIME___9.00___USEC
 91    ;
 92    ;                         MIN EXECUTION CYCLES__4__
 93    ;                         MAX EXECUTION CYCLES__16D__
 94    ;                         INTERRUPT CYCLES    __9__
 95    ;
 96    ;************************************************************************
 97 +1 $EJ
 98    ;************************************************************************
 99    NAME TASK_MARKETING_DEMO_MAIN_EXEC_BEGIN_V12
100    CSEG
101    EXTRN CODE (RAMTST, COLD_START_INITIALIZATION)
102    PUBLIC SERVICE_TIMER0,AUX_TIMER_A,AUX_TIMER_B,AUX_TIMER_C
103    USING 0
104    ;************************************************************************
105    ;                     8051 SUBSET DATA MEMORY MAP
106    ;========================================================================
107    ;                       BYTE
108    ;       NAME            ADDRESS         MODULE(S) WHERE USED
109    ;------------------------------------------------------------------------
110    HSTL            SET -36D    ;Half Second Timer0 Loop (also uses R7)
```

```
LOC  OBJ            LINE    SOURCE

FF0B                111     HSTH            SET -245D   ;Total count=(245-1)x256+36=62,500 and
                    112                                 ;  62,500 X 8 = .500 second.
0055                113     RNDM1           SET 55H
00AA                114     RNDM2           SET 0AAH
004D                115     RNDM3           SET 01001101B
00B1                116     RNDM4           SET 10110001B
0017                117     MEMCHK1         DATA 17H
0019                118     MEMCHK2         DATA 19H
006D                119     AUX_TIMER_C     DATA 6DH
006E                120     AUX_TIMER_B     DATA 6EH
006F                121     AUX_TIMER_A     DATA 6FH
0070                122     MEMCHK3         DATA 70H
007A                123     MF              DATA 7AH
00A0                124     TIME_FLAG_REG   DATA P2
                    125     ;***********************************************************
                    126     ;              8051 SUBSET DATA MEMORY MAP - CONT'D
                    127     ;===========================================================
                    128     ;                           BIT
                    129     ;     NAME                ADDRESS      MODULE(S) WHERE USED
                    130     ;-----------------------------------------------------------
                    131     ;     None
                    132     ;***********************************************************
                    133     ;
                    134     ;~~~~~~~~~~~~~~~~~~~~~~~~~~~~~~~~~~~~~~~~~~~~~~~~~~~~~~~~~~~
                    135     ;*  NOTE: FILL ALL PROGRAM MEMORY LOCATIONS WITH 02 PRIOR TO LOADING THIS   *
                    136     ;*        FILE INTO MEMORY. THUS, ANY RANDOM BRANCHES TO EMPTY LOCATIONS   *
                    137     ;*        WILL LONG JUMP TO 0202H.                                         *
                    138     ;~~~~~~~~~~~~~~~~~~~~~~~~~~~~~~~~~~~~~~~~~~~~~~~~~~~~~~~~~~~
                    139     ;
                    140     ;///////////////////////////////////////////////////////////
                    141     ;/                                                         /
                    142     ;/         --- The ROM Coding Begins Here ! ! ! ---        /
                    143     ;/                                                         /
                    144     ;///////////////////////////////////////////////////////////
                    145     ;
0000                146     ORG 00H
0000 020202         147     JMP MEMCHK
                148 +1      $EJ
                    149     ;***********************************************************
                    150     ;*                                                         *
                    151     ;*         INTERRUPT SERVICE ROUTINE FOR TIMER0            *
                    152     ;*                                                         *
                    153     ;***********************************************************
                    154     ;
000B                155     ORG 0BH         ;Interrupt Service Routine Location for Timer0
                    156                     ;  Length - 18H or 24 Dec
                    157                     ;  Min Execution Time - 11 usec @ 12 MHz
                    158                     ;  Max Execution Time - 15 usec @ 12 MHz
                    159     SERVICE_TIMER0:
000B 758ADC         160             MOV TL0,#HSTL           ;Reload Timer0 registers
000E 758C0B         161             MOV TH0,#HSTH
0011 05A0           162             INC TIME_FLAG_REG       ;T_F_R contains 8 oscillator flags from 62.5
                    163                                     ; msec to 8 sec (8 Hz to 1/16 Hz respectivly)
                    164                                     ; T_F_R.0=8 Hz to T_F_R.7=1/16 Hz) - free run
0013 156F           165             DEC AUX_TIMER_A
0015 156E           166             DEC AUX_TIMER_B
0017 156D           167             DEC AUX_TIMER_C
0019 32             168     INTRET: RETI
```

```
LOC OBJ          LINE    SOURCE

169     ;
                 170     ;
                 171     ;################################################################
                 172     ;#                                                              #
                 173     ;#              PROGRAM ENTRY LOCATION                          #
                 174     ;#                                                              #
                 175     ;################################################################
                 176     ;
0202             177             ORG 0202H               ;PROGRAM ENTRY POINT
                 178     ;
                 179     MEMCHK:                         ;Test Memory cells to determine whether RAM should be
                 180                                     ; tested! If not, jump to COLD_START_INITIALIZATION.
                 181                                     ; Note: all 4 locations must have the proper value!
0202 E517        182             MOV A,MEMCHK1
0204 B45500  F   183             CJNE A,#RNDM1,RAMTST
0207 E519        184             MOV A,MEMCHK2
0209 B4AA00  F   185             CJNE A,#RNDM2,RAMTST
020C E570        186             MOV A,MEMCHK3
020E B44D00  F   187             CJNE A,#RNDM3,RAMTST
0211 E57A        188             MOV A,MEMCHK4
0213 B4B100  F   189             CJNE A,#RNDM4,RAMTST
0216 020000  F   190             JMP COLD_START_INITIALIZATION
                 191     END
```

XREF SYMBOL TABLE LISTING

| N A M E | T Y P E | V A L U E | ATTRIBUTES AND REFERENCES |
|---|---|---|---|
| AUX_TIMER_A . . . . . . . . . . . | D ADDR | 006FH  A PUB | 102 121# 165 |
| AUX_TIMER_B . . . . . . . . . . . | D ADDR | 006EH  A PUB | 102 120# 166 |
| AUX_TIMER_C . . . . . . . . . . . | D ADDR | 006DH  A PUB | 102 119# 167 |
| COLD_START_INITIALIZATION . . . | C ADDR | ----    EXT | 101# 190 |
| HSTH . . . . . . . . . . . . . . | NUMB | FF0BH  A | 111# 161 |
| HSTL . . . . . . . . . . . . . . | NUMB | FFDCH  A | 110# 160 |
| INTRET . . . . . . . . . . . . . | C ADDR | 0019H  A | 168# |
| MEMCHK . . . . . . . . . . . . . | C ADDR | 0202H  A | 147 179# |
| MEMCHK1 . . . . . . . . . . . . . | D ADDR | 0017H  A | 117# 182 |
| MEMCHK2 . . . . . . . . . . . . . | D ADDR | 0019H  A | 118# 184 |
| MEMCHK3 . . . . . . . . . . . . . | D ADDR | 0070H  A | 122# 186 |
| MEMCHK4 . . . . . . . . . . . . . | D ADDR | 007AH  A | 123# 188 |
| P2 . . . . . . . . . . . . . . . | D ADDR | 00A0H  A | 124 |
| RAMTST . . . . . . . . . . . . . | C ADDR | ----    EXT | 101# 183 185 187 189 |
| RNDM1 . . . . . . . . . . . . . . | NUMB | 0055H  A | 113# 183 |
| RNDM2 . . . . . . . . . . . . . . | NUMB | 00AAH  A | 114# 185 |
| RNDM3 . . . . . . . . . . . . . . | NUMB | 004DH  A | 115# 187 |
| RNDM4 . . . . . . . . . . . . . . | NUMB | 00B1H  A | 116# 189 |
| SERVICE_TIMER0 . . . . . . . . . | C ADDR | 000BH  A PUB | 102 159# |
| TASK_MARKETING_DEMO_MAIN_EXEC_B | ---- | ---- | 99 |
| TH0 . . . . . . . . . . . . . . | D ADDR | 008CH  A | 161 |
| TIME_FLAG_REG . . . . . . . . . | D ADDR | 00A2H  A | 124# 162 |
| TL0 . . . . . . . . . . . . . . | D ADDR | 008AH  A | 160 |

REGISTER BANK(S) USED: 0, TARGET MACHINE(S): 8051

ASSEMBLY COMPLETE, NO ERRORS FOUND

APPENDIX 2

```
ISIS-II MCS-51 MACRO ASSEMBLER V2.0
OBJECT MODULE PLACED IN :F0:TSMEP1.OBJ
ASSEMBLER INVOKED BY: ASM51 TSMEP1.SRC XREF PW(108) TT(TSMEP1-) DA() DB EP WF(:F1:) PR(:F1:TSMEP1.LST)

LOC  OBJ        LINE    SOURCE

1      $TT(TSMEP1 - Task demo System Main Executive Program V1.1)
                 2      ;************************************************************
                 3      ; ASSUMPTIONS: 1-This software drives the Task Marketing Board which displays
                 4      ;                 5 different typical systems in which the TASK network could be
                 5      ;                 used: Automotive, Office Copier, Building Security, White
                 6      ;                 Appliance, and Energy Management.
                 7      ;              2-The Hardware is comprised of a 12 volt DC Gel-cell battery
                 8      ;                 which is charged by a modified battery charger from Globe. The
                 9      ;                 charger will supply 750 ma when the system is "ON" and only
                10      ;                 350 ma when the system is "OFF". The controller board is the
                11      ;                 same one used in the Ford Escort in North Carolina which is
                12      ;                 composed of a 5 VDC regulator, the microcomputer (Intel 8251),
                13      ;                 a watch-dog timer, and clock and data line drivers. There are
                14      ;                 15 "A" chips used in the system as well as several AC and DC
                15      ;                 power driver modules.
                16      ;              3-COLD_START_INITIALIZATION is the entry point on power-up or
                17      ;                 system reset which results from time-out of the "Watch-dog"
                18      ;                 circuit. The "Watch-dog" is constantly pulsed by the micro-
                19      ;                 computer under normal operation conditions every 1/2 to 1.25
                20      ;                 milli-seconds. This is also the entry point after system test.
                21      ;              4-WARM_START is the entry point after every complete pass of the
                22      ;                 system; i.e. after all 15 "A" chips have been serviced and
                23      ;                 processed.
                24      ; LIMITATIONS: None
                25      ; RESTRICTIONS: 1-The "Watch-dog" timer must be pulsed at least every 2 milli-
                26      ;                 seconds to insure that the system is not Reset.
                27      ; ACCURACY REQUIREMENTS: 1-The timing of all routines and timers assumes that
                28      ;                 a 12.00 MHz clock crystal is used. This produces
                29      ;                 a 1 microsecond instruction cycle time. Most
                30      ;                 instructions execute in 1 usec, but no instruction
                31      ;                 used in this project requires more than 2 usec to
                32      ;                 execute.
                33      ; METHODS USED: 1-The heart of the control sequence is determined by the code
                34      ;                 which starts at BEGIN_MAIN_EXECUTIVE. This is basically an
                35      ;                 ordered collection of subroutine calls. After all the calls,
                36      ;                 an output port pin on the micro is pulsed to indicate that
                37      ;                 the processing of the returned data from the "A" chips is
                38      ;                 finished. At this point the software waits until the 300
                39      ;                 microsecond timer is finished and then starts over.
                40      ;              2-This routine includes a Test section which is entered only if
                41      ;                 the Copier count is "F" (# key) at the same time that the
                42      ;                 # key is touched on the Security System Keypad. The test
                43      ;                 routine activates all loads, one at a time, for 1/2 second
                44      ;                 intervals.
                45      ; ALGORITHM DEFINITIONS: None
                46      ; PRE-REQUISITES: 1-The RAM has been conditionally tested; i.e. if any 1 of
                47      ;                 the four memory locations does not have the proper data
                48      ;                 in it, the RAM is completely tested and filled.
                49      ; INPUTS:
                50      ;   -I/O; P2.3(H_S_S_F)
```

APPENDIX 2

```
ISIS-II MCS-51 MACRO ASSEMBLER V2.0
OBJECT MODULE PLACED IN :F0:TSMEP1.OBJ
ASSEMBLER INVOKED BY: ASM51 TSMEP1.SRC XREF PW(108) TT(TSMEP1-) DA() DB EP WF(:F1:) PR(:F1:TSMEP1.LST)

LOC  OBJ          LINE     SOURCE

1       $TT(TSMEP1 - Task demo System Main Executive Program V1.1)
                   2       ;***********************************************************************
                   3       ; ASSUMPTIONS: 1-This software drives the Task Marketing Board which displays
                   4       ;                 5 different typical systems in which the TASK network could be
                   5       ;                 used: Automotive, Office Copier, Building Security, White
                   6       ;                 Appliance, and Energy Management.
                   7       ;              2-The Hardware is comprised of a 12 volt DC Gel-cell battery
                   8       ;                 which is charged by a modified battery charger from Globe. The
                   9       ;                 charger will supply 750 ma when the system is "ON" and only
                  10       ;                 350 ma when the system is "OFF". The controller board is the
                  11       ;                 same one used in the Ford Escort in North Carolina which is
                  12       ;                 composed of a 5 VDC regulator, the microcomputer (Intel 8051),
                  13       ;                 a watch-dog timer, and clock and data line drivers. There are
                  14       ;                 15 "A" chips used in the system as well as several AC and DC
                  15       ;                 power driver modules.
                  16       ;              3-COLD_START_INITIALIZATION is the entry point on power-up or
                  17       ;                 system reset which results from time-out of the "Watch-dog"
                  18       ;                 circuit. The "Watch-dog" is constantly pulsed by the micro-
                  19       ;                 computer under normal operation conditions every 1/2 to 1.25
                  20       ;                 milli-seconds. This is also the entry point after system test.
                  21       ;              4-WARM_START is the entry point after every complete pass of the
                  22       ;                 system; i.e. after all 15 "A" chips have been serviced and
                  23       ;                 processed.
                  24       ; LIMITATIONS: None
                  25       ; RESTRICTIONS: 1-The "Watch-dog timer must be pulsed at least every 2 milli-
                  26       ;                 seconds to insure that the system is not Reset.
                  27       ; ACCURACY REQUIREMENTS: 1-The timing of all routines and timers assumes that
                  28       ;                 a 12.00 MHz clock crystal is used. This produces
                  29       ;                 a 1 microsecond instruction cycle time. Most
                  30       ;                 instructions execute in 1 usec, but no instruction
                  31       ;                 used in this project requires more than 2 usec to
                  32       ;                 execute.
                  33       ; METHODS USED: 1-The heart of the control sequence is determined by the code
                  34       ;                 which starts at BEGIN_MAIN_EXECUTIVE. This is basically an
                  35       ;                 ordered collection of subroutine calls. After all the calls,
                  36       ;                 an output port pin on the micro is pulsed to indicate that
                  37       ;                 the processing of the returned data from the "A" chips is
                  38       ;                 finished. At this point the software waits until the 300
                  39       ;                 microsecond timer is finished and then starts over.
                  40       ;              2-This routine includes a Test section which is entered only if
                  41       ;                 the Copier count is "F" (# key) at the same time that the
                  42       ;                 # key is touched on the Security System Keypad. The test
                  43       ;                 routine activates all loads, one at a time, for 1/2 second
                  44       ;                 intervals.
                  45       ; ALGORITHM DEFINITIONS: None
                  46       ; PRE-REQUISITES: 1-The RAM has been conditionally tested; i.e. if any 1 of
                  47       ;                 the four memory locations does not have the proper data
                  48       ;                 in it, the RAM is completely tested and filled.
                  49       ; INPUTS:
                  50       ;   -I/O; P2.3(H_S_S_F)
```

| LOC  OBJ | LINE | SOURCE |
|---|---|---|
| | 51 | ;    -REGISTERS; Bank 0 Reg. 6 |
| | 52 | ;    -MAILBOXES; None |
| | 53 | ;    -FLAGS; PSW.1,PSW.5,TF1 |
| | 54 | ; OUTPUTS: |
| | 55 | ;    -I/O; P2,P2.3,P2,P3.6 |
| | 56 | ;    -REGISTERS; TL0;TL1;TH0;TH1;B;PSW;SCON;IP;IE;TMOD;TCON;SP;Bank 0 |
| | 57 | ;               Registers 0,2,5,6; Bank 1 Reg. 0,2,3; Bank 2 Reg. 0,2,3,7; |
| | 58 | ;               Bank 3, Reg. 3,4; 21H-2FH; |
| | 59 | ;    -MAILBOXES; 40H |
| | 60 | ;    -FLAGS; 2C.2,2C.6,B.6, |
| | 61 | ; REGISTERS USED: ACC, |
| | 62 | ; MAXIMUM STACK DEPTH: 6 (2 in this module ONLY) |
| | 63 | ; OUTSIDE SUBROUTINES CALLED: 1-TRNSMT |
| | 64 | ;                             2-TIMER |
| | 65 | ;                             3-AUTO_SYSTEM |
| | 66 | ;                             4-COPIER_SYSTEM |
| | 67 | ;                             5-SECURITY_SYSTEM |
| | 68 | ;                             6-WASHER |
| | 69 | ;                             7-ENERGY_SYSTEM |
| | 70 | ;                             8-ICSA |
| | 71 | ; BRANCHING: See METHODS USED #2 |
| | 72 | ; TEST CRITERIA: None that are special. |
| | 73 | ; INTERMODULE COMMUNICATION: None |
| | 74 | ; ERROR EXITS: On Reset only (pin 9 of the 8051) |
| | 75 | ;   TYPE:     Interrupt |
| | 76 | ;   PROCEDURE: At location 0BH |
| | 77 | ; |
| | 78 | ; MODULE LENGTH: __B2H BYTES (178D) |
| | 79 | ; MODULE EXECUTION TIME: CRYSTAL FREQ. ___12.00___MHZ |
| | 80 | ;                        MINIMUM TIME;  ___505.00___USEC |
| | 81 | ;                        TYPICAL TIME;  ___505.00___USEC |
| | 82 | ;                        MAXIMUM TIME;  ___650.00___USEC |
| | 83 | ; |
| | 84 | ;                        MIN EXECUTION CYCLES__1F9H_ |
| | 85 | ;                        MAX EXECUTION CYCLES__28AH_ |
| | 86 | ; |
| | 87 | ;************************************************************************ |
| | 88 +1 | $EJ |
| | 89 | NAME MAIN_EXECUTIVE |
| | 90 | MAIN_EXEC SEGMENT CODE |
| | 91 | RSEG MAIN_EXEC |
| | 92 | EXTRN CODE (TRNSMT, TIMER, ICSA, SERVICE_TIMER0, AUTO_SYSTEM, COPIER_SYSTEM) |
| | 93 | EXTRN CODE (SECURITY_SYSTEM, WASHER, ENERGY_SYSTEM) |
| | 94 | EXTRN DATA (NMBR_COPY) |
| | 95 | EXTRN BIT (FIRST_PASS_FLAG,START_COPIER_FLAG,SECURITY_LED,SYSTEM_ARMED) |
| | 96 | PUBLIC COLD_START_INITIALIZATION, WARM_START,NMBR_A_CHIPS |
| | 97 | ; |
| | 98 | ;************************************************************************ |
| | 99 | ;              8051 SUBSET DATA MEMORY MAP |
| | 100 | ;============================================================ |
| | 101 | ;                     BYTE |
| | 102 | ;   NAME             ADDRESS       MODULE(S) WHERE USED |
| | 103 | ;------------------------------------------------------------ |
| 000F | 104 | NMBR_A_CHIPS         SET 15D   ;MAX USED IN THIS PROGRAM IS 7 "A" CHIPS |
| FFDC | 105 | HSTL                 SET -36D  ;Half Second Timer0 Loop (also uses R7) |
| FF0B | 106 | HSTH                 SET -245D ;Total count=(245-1)x256+36=62,500 and |
| | 107 | ;                              ; 62,500 X 8 = .500 second. |
| FF01 | 108 | TMTL                 SET -255D ;Three Hundred Microsecond Timer1 Loop |

```
LOC  OBJ         LINE   SOURCE

FFFF             109    TMTH                SET -1D       ;Total count=(1-1)*256+255+45(from call's in
                 110                                      ; main executive and misc instructions)=320
                 111                                      ; usec.
002F             112    TOP_BIT_MAP         SET 020H+NMBR_A_CHIPS  ;MAX=02FH
                 113    ;                                 to
0021             114    A_STRT_BIT_MAP      SET 021H      ;
002F             115    STRT_BIT_MAP        SET 020H      ;
REG              116    CNTR                SET R5
REG              117    COUNTER             SET R2        ;Bank 1, Register 0AH
REG              118    COPIER_COUNTER      SET R6        ;                           A V1.6
                 119    ;***********************************************************************
                 120    ;            8051 SUBSET DATA MEMORY MAP - CONT'D
                 121    ;=======================================================================
                 122    ;                           BIT
                 123    ;         NAME              ADDRESS      MODULE(S) WHERE USED
                 124    ;-----------------------------------------------------------------------
00D5             125    TEST_FLAG           BIT PSW.5    ;D5H
00D1             126    FINISHED_FLAG       BIT PSW.1    ;D1H
00F6             127    DIM_FLAG            BIT B.6H     ;F6H
00A3             128    HALF_SECOND_STATUS_FLAG  BIT 92.3
00B6             129    END_PROCESS_PULSE   BIT P3.6     ;B6H
                 130 +1 $EJ
                 131    ;***********************************************************************
                 132    ;*                                                                     *
                 133    ;*              START MAIN EXECUTIVE                                   *
                 134    ;*                                                                     *
                 135    ;***********************************************************************
                 136    COLD_START_INITIALIZATION:       ;Starting point for initial power-up only!
0000 758ADC      137           MOV  TL0,#HSTL            ;Set-up for 62 msec interrupt service routine
0003 758C0B      138           MOV  TH0,#HSTH            ;Set-up for 62 msec interrupt service routine
0006 75F000      139           MOV  B,#0H                ;Clr DIM_FLAG,KPM_CMPLNT_FLAG,ALARM,
                 140                                     ; KEY_SERVICED,KEY_SERVICED1,FIRST_PASS_FLAG,
                 141                                     ; START_COPIER_FLAG=.6 to .0
0009 75B0FF      142           MOV  P3,#0FFH             ;Set all flags=1 in P3
000C 75080F      143           MOV  08H,#0FH             ;R0 now pointing to R7 in Bank 1
000F 7528FE      144           MOV  28H,#11111110B       ;Set-up for keypad scan
0012 752DFE      145           MOV  2DH,#11111110B       ;Set-up for keypad scan
0015 750B08      146           MOV  0BH,#08H             ;Initial R3 of Bank 1 - Index Counter
0018 751308      147           MOV  13H,#08H             ;Initial R3 of Bank 2 - Index Counter
001B 751BFF      148           MOV  1BH,#0FFH            ;Initial R3 of Bank 3 - WASHER_SWS
001E 751C00      149           MOV  1CH,#00H             ;Initial R4 of Bank 3 - WSHR_CNTR
0021 750A01      150           MOV  0AH,#1H              ;Initial Counter value (R2 in Bank 1)
0024 751101      151           MOV  11H,#1H              ;Initial Counter value (R2 in Bank 2)
0027 751053      152           MOV  10H,#53H             ;INDEX_POINTER-R0, Bank 2
002A 751704      153           MOV  17H,#04D             ;DIGIT_COUNTER-R7, Bank 2
002D 750000   F  154           MOV  NMBR_COPY,#0H        ;Used in PROCESS_DATA Routine
0030 7E04        155           MOV  COPIER_COUNTER,#04D  ;Used in PROCESS_DATA Routine
0032 7527AA      156           MOV  27H,#10101010B       ;Set Copier display device to "0"
0035 750564      157           MOV  05,#100D             ;Set-up for CNTR(R5,Bnk 0) in PROCESS_DATA Routine
0038 C200     F  158           CLR  SECURITY_LED         ;Beam LED in Security section = "ON"
003A D200     F  159           SETB SYSTEM_ARMED
003C D200        160           SETB 20H.0                ;KEY_DECODED_NOT
                 161    ;(((((((((((((((((((((((((( MAIN LOOP ENTRY )))))))))))))))))))))))))))))
                 162    WARM_START:
003E 75D020      163           MOV  PSW,#00100000B       ;PSW Condition: Bank 0, TEST_FLAG & FINISHED_
                 164                                     ; FLAG=OFF (T_F=1, F_F=0)
0041 53980C      165           ANL  SCON,#00001100B      ;Flags in TB8, RB8 not reset to "0" in SCON
0044 75B800      166           MOV  IP,#00H              ;All interrupts are low priority
```

```
LOC  OBJ           LINE   SOURCE 0047 75A8E2         167            MOV IE,#11100010B        ;Note: In the TRANSMT routine, be sure to
                    168                                     ; disable interrupts and to enable the
                    169                                     ; transmit driver upon entering the routine.
                    170                                     ; Do opposite before exiting.
004A 758911         171            MOV TMOD,#11H            ;Both Timers configured as 16 bit Counters
004D 758850         172            MOV TCON,#01010000B      ;Both Timers are now running
0050 758B01         173            MOV TL1,#TMTL
0053 758DFF         174            MOV TH1,#TMTH            ;Timer 1 count now initialized
0056 75815F         175            MOV SP,#05FH             ;Initialize Stack Pointer to start at 60H
0059 43B076         176            ORL P3,#076H             ;All ports set to "1" except .7, .3, and .0
                    177                                     ; which remain unchanged
                    178    ;-----------------------------
                    179    BEGIN_MAIN_EXECUTIVE:
005C 120000    F    180            CALL TRNSMT              ;Transmit data to remote "A" chips
005F 120000    F    181            CALL TIMER               ;Initiate 300 usec delay
0062 B2F6           182            CPL DIM_FLAG
0064 120000    F    183            CALL AUTO_SYSTEM
0067 120000    F    184            CALL COPIER_SYSTEM
006A 120000    F    185            CALL SECURITY_SYSTEM
006D 120000    F    186            CALL WASHER
0070 120000    F    187            CALL ENERGY_SYSTEM
0073 C2B6           188            CLR END_PROCESS_PULSE
0075 D2B6           189            SETB END_PROCESS_PULSE   ;Issue pulse indicating processing is complete
0077 308FFD         190            JNB TF1,$                ;Wait for end of 300 usec delay (shorter than
                    191                                     ; 300 to accomodate for instructions in the
                    192                                     ; main loop)
007A 30D502         193            JNB TEST_FLAG,TEST_ROUTINE ;If Test Flag bit is "ON", initiate test
007D 80BF           194            JMP WARM_START           ;Go to Top of Loop
                    195 +1 $EJ
                    196    ;################################################################
                    197    ;#
                    198    ;#                    START TEST EXECUTIVE
                    199    ;#
                    200    ;################################################################
                    201    ;
                    202    TEST_ROUTINE:                    ;Cycle every command "ON" for 1/2 second
007F 7820           203            MOV R0,#STRT_BIT_MAP
0081 74FF           204            MOV A,#0FFH
0083 7D01           205            MOV CNTR,#01H            ;Reset up-count in PROCESS_DATA subroutine
0085 F6             206    FBML:   MOV @R0,A                ;Fill Bit Map Loop with "1"'s
0086 08             207            INC R0
0087 B830FB         208            CJNE R0,#TOP_BIT_MAP+1,FBML
                    209    ;
                    210    ;======INITIALIZE========
                    211    ;
008A 7821           212            MOV R0,#A_STRT_BIT_MAP   ;Pre-requisite for ICSA routine
008C 7521BF         213            MOV A_STRT_BIT_MAP,#10111111B ;Pre-requisite for ICSA routine
008F 7A05           214            MOV R2,#05H              ;Pre-requisite for ICSA routine
0091 120000    F    215            CALL ICSA                ;Pre-requisite for ICSA routine
0094 75A000         216            MOV P2,#0D              ;This guarantees 1st lamp on for 1/2 sec
                    217    ;
                    218    ;(((((((((((((((((((((((( MAIN TEST LOOP ENTRY ))))))))))))))))))))))))*)
                    219    ;
                    220    TEST_LOOP:                       ;Transmit same data pattern for 1/2 second
0097 120000    F    221            CALL TRNSMT              ;Transmit data to remote "A" chips
009A 120000    F    222            CALL TIMER               ;Initiate 300 usec delay and issue Watchdog
                    223                                     ; Pulse
009D 308FFD         224            JNB TF1,$                ;Wait for end of 300 usec delay (shorter than
```

```
LOC  OBJ          LINE   SOURCE

225                              ; 300 to accomodate for instructions in the
                  226                              ; test loop)
00A0 7E0B         227           MOV R6,#11D
00A2 DEFE         228           DJNZ R6,$          ;Delay 24 usec - compensate for fewer
                  229                              ; instructions in test loop so that overall
                  230                              ; dead time between clock bursts is 300 usec.
00A4 30A3F0       231           JNB HALF_SECOND_STATUS_FLAG,TEST_LOOP  ;If H_S_S_F=0, repeat loop
00A7 B2A3         232           CPL HALF_SECOND_STATUS_FLAG
00A9 120000  F    233           CALL ICSA          ;Increment to next Command!
00AC 30D1E8       234           JNB FINISHED_FLAG,TEST_LOOP;If Last Command issued,return to main loop
00AF 020000  F    235           JMP COLD_START_INITIALIZATION
                  236     END
```

XREF SYMBOL TABLE LISTING
─── ────── ───── ───────

| NAME | TYPE | VALUE | | ATTRIBUTES AND REFERENCES |
|---|---|---|---|---|
| A_STRT_BIT_MAP | NUMB | 0021H | A | 114# 212 213 |
| AUTO_SYSTEM | C ADDR | ---- | EXT | 92# 183 |
| B | D ADDR | 00F0H | A | 127 139 |
| BEGIN_MAIN_EXECUTIVE | C ADDR | 005CH | R | SEG=MAIN_EXEC 179# |
| CNTR | REG | R5 | | 116# 205 |
| COLD_START_INITIALIZATION | C ADDR | 0000H | R PUB | SEG=MAIN_EXEC 96 136# 235 |
| COPIER_COUNTER | REG | R6 | | 118# 155 |
| COPIER_SYSTEM | C ADDR | ---- | EXT | 92# 184 |
| COUNTER | REG | R2 | | 117# |
| DIM_FLAG | B ADDR | 00F0H.6 | A | 127# 182 |
| END_PROCESS_PULSE | B ADDR | 00B0H.6 | A | 129# 188 189 |
| ENERGY_SYSTEM | C ADDR | ---- | EXT | 93# 187 |
| FBML | C ADDR | 0085H | R | SEG=MAIN_EXEC 206# 208 |
| FINISHED_FLAG | B ADDR | 00D0H.1 | A | 126# 234 |
| FIRST_PASS_FLAG | B ADDR | ---- | EXT | 95# |
| HALF_SECOND_STATUS_FLAG | B ADDR | 00A0H.3 | A | 128# 231 232 |
| HSTH | NUMB | FF06H | A | 106# 138 |
| HSTL | NUMB | FFDCH | A | 105# 137 |
| ICSA | C ADDR | ---- | EXT | 92# 215 233 |
| IE | D ADDR | 00A8H | A | 167 |
| IP | D ADDR | 00B8H | A | 166 |
| MAIN_EXEC | C SEG | 00B2H | | REL=UNIT 90# 91 |
| MAIN_EXECUTIVE | | ---- | | 89 |
| NMBR_A_CHIPS | NUMB | 000FH | A PUB | 96 104# 112 |
| NMBR_COPY | D ADDR | ---- | EXT | 94# 154 |
| P2 | D ADDR | 00A0H | A | 128 216 |
| P3 | D ADDR | 00B0H | A | 129 142 176 |
| PSW | D ADDR | 00D0H | A | 125 126 163 |
| SCON | D ADDR | 0098H | A | 165 |
| SECURITY_LED | B ADDR | ---- | EXT | 95# 158 |
| SECURITY_SYSTEM | C ADDR | ---- | EXT | 93# 185 |
| SERVICE_TIMER0 | C ADDR | ---- | EXT | 92# |
| SP | D ADDR | 0081H | A | 175 |
| START_COPIER_FLAG | B ADDR | ---- | EXT | 95# |
| STRT_BIT_MAP | NUMB | 0020H | A | 115# 203 |
| SYSTEM_ARMED | B ADDR | ---- | EXT | 95# 159 |
| TCON | D ADDR | 0088H | A | 172 |
| TEST_FLAG | B ADDR | 00D0H.5 | A | 125# 193 |
| TEST_LOOP | C ADDR | 0097H | R | SEG=MAIN_EXEC 220# 231 234 |

| NAME | TYPE | VALUE | ATTRIBUTES AND REFERENCES |
|---|---|---|---|
| TEST_ROUTINE | C ADDR | 307FH | R     SEG=MAIN_EXEC  193 229 |
| TF1 | B ADDR | 0088H.7 | A     190 224 |
| TH0 | D ADDR | 008CH | A     136 |
| TH1 | D ADDR | 008DH | A     174 |
| TIMER | C ADDR | ---- | EXT   92# 181 222 |
| TL0 | D ADDR | 008AH | A     137 |
| TL1 | D ADDR | 008BH | A     173 |
| TMOD | D ADDR | 0089H | A     171 |
| TMTH | NUMB | FFFFH | A     109# 174 |
| TMTL | NUMB | FF01H | A     108# 173 |
| TOP_BIT_MAP | NUMB | 002FH | A     112# 208 |
| TRNSMT | C ADDR | ---- | EXT   92# 180 221 |
| WARM_START | C ADDR | 003EH | R PUB SEG=MAIN_EXEC  96 162# 194 |
| WASHER | C ADDR | ---- | EXT   93# 186 |

REGISTER BANK(S) USED: 0, TARGET MACHINE(S): 8051

ASSEMBLY COMPLETE, NO ERRORS FOUND

APPENDIX 3

ISIS-II MCS-51 MACRO ASSEMBLER V2.0
OBJECT MODULE PLACED IN :F0:TSTRN0.OBJ
ASSEMBLER INVOKED BY: ASM51 TSTRN0.SRC XREF PW(108) TT(TSTRN0-) DA() DB EP WF(:F1:) PR(:F1:TSTRN0.LST)

```
LOC  OBJ          LINE    SOURCE

1     $TT(TSTRN0 - Task demo System TRaNsmit V1.0)
                    2     ;################################################################
                    3     ; ASSUMPTIONS: 1-The system contains up to 32 "A" chips. The exact number is
                    4     ;                 determined by the parameter NMBR_A_CHIPS.
                    5     ;              2-System format is alternating commands and responses. Logic
                    6     ;                 is active low. The UART issues up to 32 data bursts of 8 bits
                    7     ;                 each. Initially the UART issues command0(C0) followed by a "1"
                    8     ;                 followed by C2, etc. During the "1" state, Port 3.4 is read
                    9     ;                 which represents the response(R0) of the 1st "A" chip.
                   10     ;              3-Up to 128 commands are sent in groups of 8 bits via the UART
                   11     ;                 where the 8 bits are composed of alternating commands and
                   12     ;                 "1"'s. These patterns are stored prior to transmission in
                   13     ;                 internal RAM locations 50H to 6FH. There are 32 bytes where
                   14     ;                 each byte contains 4 commands. Note: on systems with less
                   15     ;                 than 17 "A" chips, patterns for transmission are stored in
                   16     ;                 the Bit Memory located in the range of 20H to 2FH.
                   17     ;              4-Responses are stored in internal RAM at 30H to 4FH. Only the
                   18     ;                 high nibble of each byte contains desireable data.
                   19     ;              5-The Data Line is tested after each data burst to determine
                   20     ;                 if a short on the data line exists.
                   21     ;              6-This routine sacrifices code space to maximize operating
                   22     ;                 speed. The code is very repetitive; however, to make
                   23     ;                 loop would require additional testing after each UART data
                   24     ;                 burst which would increase transmission interburst dead
                   25     ;                 time. So as it is, the interburst dead time is 5 machine
                   26     ;                 cycles.
                   27     ;              7-If the data line becomes shorted during this routine, the
                   28     ;                 test JNB P3.4,$ will cause the code to execute an endless
                   29     ;                 loop at that instruction. However, the "Watchdog Timer" will
```

```
LOC  OBJ        LINE   SOURCE

30    ;            cause a reset to code location 202H. This action will result
                 31    ;            in another loop at the start of the TRNSMT routine untill
                 32    ;            reset again. This process will continue until the short on
                 33    ;            the data line is cleared.
                 34    ; LIMITATIONS: 1-No more than 32 "A" chips can be used-this is the maximum
                 35    ;            capacity.
                 36    ; RESTRICTIONS: 1-Normally C0 of the 1st "A" chip and R4 of the last chip
                 37    ;              would not be used because of data security; however, in
                 38    ;              the enviornmental test routine, they will be used.
                 39    ;            2-All interrupts MUST be disabled during UART transmission!
                 40    ;              However, they are re-enabled in another routine.
                 41    ; ACCURACY REQUIREMENTS: 1-System speed is 1Mhz with a 12Mhz crystal.
                 42    ;                       2-System refresh time must be less than 1.75mSec.
                 43    ;                       3-In order to syncronize the sensing of the data
                 44    ;                         line under software control with the timing of the
                 45    ;                         UART, 2 instruction cycles must occur between the
                 46    ;                         starting of the UART and the read of the data line.
                 47    ;                         Additionally, 1 instruction cycle must occur between
                 48    ;                         each read of the data line.
                 49    ;                       4-Without checking the data line for a shorted
                 50    ;                         condition, the interburst dead time is limited to
                 51    ;                         3 instruction cycles(@ TXD=1Mhz, that is 3 uSec).
                 52    ; METHODS USED: 1-The typical transmit cell consists of:
                 53    ;              A-Start UART by moving a command burst into SBUF from
                 54    ;                the area of 50H to 6FH (20H to 2FH on small systems).
                 55    ;              B-Move the data collected in the accumulator from the
                 56    ;                previous burst (which is the accumulation of all the
                 57    ;                desired responses) into RAM storage area 30H to 4FH.
                 58    ;              C-Move P3.4 into the "C" register and then rotate it
                 59    ;                into the accumulator. Do this 4 times.
                 60    ; ALGORITHM DEFINITIONS: None
                 61    ; PRE-REQUISITES: 1-The UART has been previously configured for Mode 0 and the
                 62    ;                   associated Timer also properly configured.
                 63    ;                 2-The number of clock and data bursts is determined by the
                 64    ;                   parameter NUMBER_A_CHIPS.
                 65    ; INPUTS:
                 66    ;   -I/O; P3.4=Input Data from DATA LINE.
                 67    ;   -REGISTERS; None
                 68    ;   -MAILBOXES; None
                 69    ;   -FLAGS; None
                 70    ;   -OTHER MODULES:
                 71    ;     -I/O; None
                 72    ;     -REGISTERS; None
                 73    ;     -MAILBOXES; None
                 74    ;     -FLAGS; None
                 75    ;   -OTHER SUBROUTINES:
                 76    ;     -I/O; None
                 77    ;     -REGISTERS; None
                 78    ;     -MAILBOXES; None
                 79    ;     -FLAGS; None
                 80    ; OUTPUTS:
                 81    ;   -I/O; P3.0(RXD) and P3.1(TXD) are Data and Clock respectively under
                 82    ;         control of the UART; P3.5(BH.5)-TASK_DISABLE_NL_H_EQ_DSBL;
                 83    ;         P3.2(BH.2)-WATCHDOG
                 84    ;   -REGISTERS; 20H to 2FH=Command Storage Area; 30H to 3FH=Response Storage
                 85    ;               area
                 86    ;   -MAILBOXES; None
                 87    ;   -FLAGS; EA(AFH)
```

```
LOC OBJ    LINE   SOURCE

88    ;   -OTHER MODULES:
            89    ;     -I/O; None
            90    ;     -REGISTERS; None
            91    ;     -MAILBOXES; None
            92    ;     -FLAGS; None
            93    ;   -OTHER SUBROUTINES:
            94    ;     -I/O; None
            95    ;     -REGISTERS; None
            96    ;     -MAILBOXES; None
            97    ;     -FLAGS; None
            98    ; REGISTERS USED: ACC, C, P3.0, P3.1, P3.2, P3.4, P3.5, 20H-2FH, 30H-3FH, EA
            99    ; MAXIMUM STACK DEPTH: 0
           100    ; OUTSIDE SUBROUTINES CALLED: None
           101    ; BRANCHING: None
           102    ; EXTERNAL LABELS: None
           103    ; TEST CRITERIA: Test all functional aspects of this module with the EMV51
           104    ;                Emulation Vehicle.
           105    ; INTERMODULE COMMUNICATION: None
           106    ; ERROR EXITS: None
           107    ;   TYPE;
           108    ;   PROCEDURE;
           109    ;
           110    ; MODULE LENGTH: _14EH; _334Dec BYTES
           111    ; MODULE EXECUTION TIME:
           112    ;   -CRYSTAL FREQ. ___12.00___MHZ
           113    ;    MINIMUM TIME; __202.00___USEC
           114    ;    TYPICAL TIME; __202.00___USEC
           115    ;    MAXIMUM TIME; _Infinite__USEC
           116    ;
           117    ;    MIN EXECUTION CYCLES; _CAH; __202Dec
           118    ;    TYP EXECUTION CYCLES; _CAH; __202Dec
           119    ;    MAX EXECUTION CYCLES; Inf H; Inf _Dec
           120    ;
           121    ;****************************************************************
           122 +1 $EJ
           123    NAME TRANSMIT_ROUTINE
           124    TRANSMIT SEGMENT CODE
           125    RSEG TRANSMIT
           126    EXTRN NUMBER (NMBR_A_CHIPS)
           127    PUBLIC TRNSMT
           128    ;****************************************************************
           129    ;                 8051 SUBSET DATA MEMORY MAP
           130    ;================================================================
           131    ;                         BYTE
           132    ;   NAME                 ADDRESS          MODULE(S) WHERE USED
           133    ;----------------------------------------------------------------
           134    ;SET(NUMBER_A_CHIPS,6) ;Used in TRNSMT:16=# "A" chips in system-Max=16(0-15)
           135 +2
           136    ;TOP_RSP_S_A           SET 030H+NMBR_A_CHIPS ;MAX=34FH
           137    ;                      to
0030       138    STRT_RSP_S_A          SET 030H ;
           139    ;****************************************************************
           140    ;
           141    ;****************************************************************
           142    ;            8051 SUBSET DATA MEMORY MAP - CONT'D
           143    ;================================================================
           144    ;                         BIT
           145    ;   NAME                 ADDRESS          MODULE(S) WHERE USED
```

| LOC OBJ | LINE | SOURCE | | |
|---|---|---|---|---|
| | 146 | ; | | |
| 00B5 | 147 | TASK_DISABLE_NL_H_EQ_DSBL | BIT P3.5 | ;B5H |
| 00B4 | 148 | INPUT_DATA | BIT P3.4 | ;B4H |
| 00B2 | 149 | WATCHDOG | BIT P3.2 | ;B2H |
| | 150 | ;**************************************************** | | |
| | 151 +1 | $EJ | | |
| | 152 | TRNSMT: | | |
| 0000 C2AF | 153 | CLR EA | ;Global interrupt disable prior to UART transmission | |
| 0002 C2B5 | 154 | CLR TASK_DISABLE_NL_H_EQ_DSBL | ;Enable TASK transmissions. If used, | |
| | 155 | | ; this port disables TASK transmissions during the | |
| | 156 | | ; processing of returned data. Thus, TXD and RXD can | |
| | 157 | | ; be used for other purposes (i.e. I/O expansion). | |
| 0004 30B4FD | 158 | JNB P3.4,$ | ;Test Data Line; if low, wait here until it is high | |
| | 159 | Transmit_Burst_0: | | |
| 0007 852099 | 160 | MOV SBUF,20H | ;Start of Command Storage area-UART Now started | |
| 000A C2B2 | 161 | CLR WATCHDOG | ;Needed to syncronize Port 3.4 read timing with UART | |
| | 162 | | ; timing and provide Watchdog timer pulse servicing | |
| 000C D2B2 | 163 | SETB WATCHDOG | ;Needed to syncronize Port 3.4 read timing with UART | |
| | 164 | | ; timing and provide Watchdog timer pulse servicing | |
| 000E A2B4 | 165 | MOV C,P3.4 | ;Read R0 of burst 0 | |
| 0010 13 | 166 | RRC A | ;Put the value of R0 into ACC bit 7 | |
| 0011 A2B4 | 167 | MOV C,P3.4 | ;Read R1 of burst 0 | |
| 0013 13 | 168 | RRC A | ;Put the value of R1 into ACC bit 7 | |
| 0014 A2B4 | 169 | MOV C,P3.4 | ;Read R2 of burst 0 | |
| 0016 13 | 170 | RRC A | ;Put the value of R2 into ACC bit 7 | |
| 0017 A2B4 | 171 | MOV C,P3.4 | ;Read R3 of burst 0 | |
| 0019 30B4FD | 172 | JNB P3.4,$ | ;Test Data Line; if low, wait here until it is high | |
| | 173 | Transmit_Burst_1: | | |
| 001C 852199 | 174 | MOV SBUF,21H | ;Command Storage area-UART Now started | |
| 001F 13 | 175 | RRC A | ;Put the value of R3 of Burst 0 into ACC bit 7 | |
| 0020 F530 | 176 | MOV 30H,A | ;Start of Response Storage Area-Responses of "A0" now | |
| | 177 | | ; in RAM | |
| 0022 A2B4 | 178 | MOV C,P3.4 | ;Read R0 of burst 1 | |
| 0024 13 | 179 | RRC A | ;Put the value of R0 into ACC bit 7 | |
| 0025 A2B4 | 180 | MOV C,P3.4 | ;Read R1 of burst 1 | |
| 0027 13 | 181 | RRC A | ;Put the value of R1 into ACC bit 7 | |
| 0028 A2B4 | 182 | MOV C,P3.4 | ;Read R2 of burst 1 | |
| 002A 13 | 183 | RRC A | ;Put the value of R2 into ACC bit 7 | |
| 002B A2B4 | 184 | MOV C,P3.4 | ;Read R3 of burst 1 | |
| 002D 30B4FD | 185 | JNB P3.4,$ | ;Test Data Line; if low, wait here until it is high | |
| | 186 +1 | $NOGEN | | |
| | 187 | ;---The following Def... is a macro definition--- | | |
| | 188 | %*Define(TRANSMIT_X(CNT,CSA,RSA,CNT_MNS_1))( | | |
| | | %IF(%CNT GT %NUMBER_A_CHIPS)THEN(%EXIT)FI | | |
| | | Transmit_Burst_%CNT: | | |
| | | MOV SBUF,%CSA | ;Command Storage Area-UART Now started | |
| | | RRC A | ;Put the value of R3 into ACC bit 7 | |
| | | MOV %RSA,A | ;Rsonse Storage Area-Responses of "A%CNT_MNS_1" in RAM | |
| | | MOV C,P3.4 | ;Read R0 of burst %CNT | |
| | | RRC A | ;Put the value of R0 into ACC bit 7 | |
| | | MOV C,P3.4 | ;Read R1 of burst %CNT | |
| | | RRC A | ;Put the value of R1 into ACC bit 7 | |
| | | MOV C,P3.4 | ;Read R2 of burst %CNT | |
| | | RRC A | ;Put the value of R2 into ACC bit 7 | |
| | | MOV C,P3.4 | ;Read R3 of burst %CNT | |
| | | JNB P3.4,$ | ;Test Data Line; if low, wait here until it is high | |
| | | ) | | |
| | 189 | ;---The following TRAN... is a macro expansion--- | | |

```
LOC  OBJ        LINE    SOURCE

190         %TRANSMIT_X(2,22H,31H,1)
                205         %TRANSMIT_X(3,23H,32H,2)
                220         %TRANSMIT_X(4,24H,33H,3)
                235         %TRANSMIT_X(5,25H,34H,4)
                250         %TRANSMIT_X(6,26H,35H,5)
                265         %TRANSMIT_X(7,27H,36H,6)
                280         %TRANSMIT_X(8,28H,37H,7)
                295         %TRANSMIT_X(9,29H,38H,8)
                310         %TRANSMIT_X(10,2AH,39H,9)
                325         %TRANSMIT_X(11,2BH,3AH,10)
                340         %TRANSMIT_X(12,2CH,3BH,11)
                355         %TRANSMIT_X(13,2DH,3CH,12)
                370         %TRANSMIT_X(14,2EH,3DH,13)
                385         %TRANSMIT_X(15,2FH,3EH,14)
                400     $GO
0148 13         401         RRC A                           ;Put the value of R3 into ACC bit 7
0149 F500    F  402         MOV STRT_RSP_S_A+NMBR_A_CHIPS,A ;Top of Response Storage area
014B D2B5       403         SETB TASK_DISABLE_NL_H_EQ_DSBL  ;Disable TASK transmissions
014D 22         404         RET                             ;Return from this subroutine
                405     END
```

XREF SYMBOL TABLE LISTING

| NAME | TYPE | VALUE | | ATTRIBUTES AND REFERENCES |
|---|---|---|---|---|
| EA. . . . . . . . . . . . | B ADDR | 00A8H.7 | A | 153 |
| INPUT_DATA. . . . . . . . | B ADDR | 00B0H.4 | A | 148# |
| NMBR_A_CHIPS. . . . . . | NUMB | ———— | EXT | 125# 402 |
| P3. . . . . . . . . . . . | D ADDR | 00B0H | A | 147 148 149 158 165 167 169 171 172 178 180 182 184 185 196 198 200 202 203 211 213 215 217 218 226 228 230 232 233 241 243 245 247 248 256 258 260 262 263 271 273 275 277 278 286 288 290 292 293 301 303 305 307 308 316 318 320 322 323 331 333 335 337 338 346 348 350 352 353 361 363 365 367 368 376 378 380 382 383 391 393 395 397 398 |
| SBUF. . . . . . . . . . | D ADDR | 0099H | A | 160 174 193 208 223 238 253 268 283 298 313 328 343 358 373 388 |
| STRT_RSP_S_A. . . . . . | NUMB | 0030H | A | 138# 402 |
| TASK_DISABLE_NL_H_EQ_DSBL | B ADDR | 00B0H.5 | A | 147# 154 403 |
| TRANSMIT_BURST_0. . . . . | C ADDR | 0007H | R | SEG=TRANSMIT 159# |
| TRANSMIT_BURST_1. . . . . | C ADDR | 001CH | R | SEG=TRANSMIT 173# |
| TRANSMIT_BURST_10 . . . . | C ADDR | 00D0H | R | SEG=TRANSMIT 312# |
| TRANSMIT_BURST_11 . . . . | C ADDR | 00E4H | R | SEG=TRANSMIT 327# |
| TRANSMIT_BURST_12 . . . . | C ADDR | 00F8H | R | SEG=TRANSMIT 342# |
| TRANSMIT_BURST_13 . . . . | C ADDR | 010CH | R | SEG=TRANSMIT 357# |
| TRANSMIT_BURST_14 . . . . | C ADDR | 0120H | R | SEG=TRANSMIT 372# |
| TRANSMIT_BURST_15 . . . . | C ADDR | 0134H | R | SEG=TRANSMIT 387# |
| TRANSMIT_BURST_2. . . . . | C ADDR | 0030H | R | SEG=TRANSMIT 192# |
| TRANSMIT_BURST_3. . . . . | C ADDR | 0044H | R | SEG=TRANSMIT 207# |
| TRANSMIT_BURST_4. . . . . | C ADDR | 0058H | R | SEG=TRANSMIT 222# |
| TRANSMIT_BURST_5. . . . . | C ADDR | 006CH | R | SEG=TRANSMIT 237# |
| TRANSMIT_BURST_6. . . . . | C ADDR | 0080H | R | SEG=TRANSMIT 252# |
| TRANSMIT_BURST_7. . . . . | C ADDR | 0094H | R | SEG=TRANSMIT 267# |
| TRANSMIT_BURST_8. . . . . | C ADDR | 00A8H | R | SEG=TRANSMIT 282# |
| TRANSMIT_BURST_9. . . . . | C ADDR | 00BCH | R | SEG=TRANSMIT 297# |
| TRANSMIT_ROUTINE. . . . . | ———— | ———— | | 123 |

| | | | | | |
|---|---|---|---|---|---|
| TRANSMIT. . . . . . . . . | C SEG | 014EH | | REL=UNIT | 124# 125 |
| TRNSMT. . . . . . . . . . | C ADDR | 0000H | R PUB | SEG=TRANSMIT | 127 152# |
| WATCHDOG. . . . . . . . . | B ADDR | 0020H.2 | A | | 149# 161 163 |

REGISTER BANK(S) USED: 0, TARGET MACHINE(S): 8051

ASSEMBLY COMPLETE, NO ERRORS FOUND

APPENDIX 4

ISIS-II MCS-51 MACRO ASSEMBLER V2.0
OBJECT MODULE PLACED IN :F0:TSSRK1.OBJ
ASSEMBLER INVOKED BY: ASM51 TSSRK1.SRC XREF PW(108) TT(TSSRK1-) DA() DB EP WF(:F1:) PR(:F1:TSSRK1.LST)

LOC OBJ         LINE    SOURCE

```
   1    $TT(TSSRK1 - Task System SeRvice Keypad V1.1)
   2    ;**********************************************************************
   3    ; ASSUMPTIONS: 1-Routine runs under TMMEP0.SRC or later which services 16 "A"
   4    ;                chips.
   5    ;              2-Keypad is connected to an "A" chip with Row 1 to Row 4 of the
   6    ;                keypad connected to C0 to C3 respectively. Also Column 1 to
   7    ;                Column 4 of the keypad is connected to R0 to R3 respectively.
   8    ;              3-Bank 2 is used for all tempory register manipulations. R4
   9    ;                contains the tempory location of column activation for keypad
  10    ;                rows 1 thru 4 respectively. R1 contains the number of the row
  11    ;                that was activated (row 1 to 4) which is used for calculation
  12    ;                purposes in another routine. However, the row number is X 2.
  13    ;              4-A key must be held down for > 80 msec to be considered a valid
  14    ;                activation.
  15    ;              5-With a 16 "A" Chip system, the keypad is scanned every 4
  16    ;                msec which correspondes to 8 passes of the entire system. On
  17    ;                the first pass of the system, the first row is set low(C0). On
  18    ;                the second pass the "A" chip is read and tested. A low on any
  19    ;                response (R0 to R3) indicates that a key in the first row was
  20    ;                depressed. On the third pass the second row is driven low(C1).
  21    ;                On the fourth pass, the responses are again read, etc. This
  22    ;                process continues until the 8th pass is finished at which time
  23    ;                the returned and collected data is decoded.
  24    ;              6-This routine is called from another subroutine.
  25    ;              7-Since Response inputs have pull-up resistors, a "1" is
  26    ;                normally read into the TASK system as long as no key was
  27    ;                depressed. Note that the TASK arcitecture is negative true.
  28    ;                A "0" is applied to one row (Command Output) at a time and if
  29    ;                a key is depressed that "0" will appear on the appropriate
  30    ;                column (Response Input) as it is scanned.
  31    ;              8-All internal program flags are positive true, e.g. Key_Dep.
  32    ;              9-This routine only services the "A" chip to which a keypad is
  33    ;                connected; another routine is responsible for "Debouncing"
  34    ;                and "Decoding" the key that was depressed.
  35    ; LIMITATIONS: 1-Any momentary power outage will turn off all loads because
  36    ;                inputs from the keyboard are only momentary. Thus, they must
  37    ;                be stored in memory and if the power fails, the status of the
  38    ;                memory is lost. The only way around this problem is to
  39    ;                provide back-up battery power to the 8051's RAM memory.
  40    ; RESTRICTIONS: 1-This routine requires a 12 Mhz clock for the selected
  41    ;                counts that are used.
  42    ; ACCURACY REQUIREMENTS: None
```

```
LOC OBJ      LINE   SOURCE

43     ; METHODS USED: 1-Verify that the PASS_CNTR is in the range of 0 to 8. If it is
             44     ;                  not reset all applicable registers to their starting values.
             45     ;               2-On odd counts of PASS_CNTR, test for key depressions on the
             46     ;                  currently scanned row. If the count is even, make no tests.
             47     ;               3-If data exists, mask it and store it in R4. Also store the
             48     ;                  row number being scanned in R1 (This will be times 2).
             49     ;                  However, only store the data if it is the first time that
             50     ;                  the key has been depressed. Also set the flag KEY_DEP1. This
             51     ;                  action permits the beginning of contact "Debouncing" in
             52     ;                  another routine. This flag is always cleared in the other
             53     ;                  routine on every pass of system.
             54     ;               4-Alter the KEY_CMND_REG to prepare for the driving of the
             55     ;                  next row whenever the PASS_CNTR is odd.
             56     ;               5-Whenever PASS_CNTR is zero, reset all pertinent registers
             57     ;                  to their initial values.
             58     ; ALGORITHM DEFINITIONS: None
             59     ; PRE-REQUISITES: 1-During Cold-Start the following registers must be properly
             60     ;                  set-up: 2DH=11111110B; R3(13H)=6H; R2(12H)=1H
             61     ; INPUTS:
             62     ;  -I/O: None
             63     ;  -REGISTERS: 3DH - Returned "A" chip responses from device #13; 2DH - KEY_
             64     ;              CMND_REG
             65     ;  -MAILBOXES: INTGRTN_CNTR(R2, Bank 2)
             66     ;  -FLAGS: None
             67     ; OUTPUTS:
             68     ;  -I/O: None
             69     ;  -REGISTERS: None
             70     ;  -MAILBOXES: KEY_COL_DATA(14H - R4, Bank2); KEY_ROW_POINTER(11H - R1,Bank 2)
             71     ;  -FLAGS: KEY_DEP1(BH.7),KEY_SERVICED1(BH.2),RS0,RS1
             72     ; REGISTERS USED: R3(Bank 2), ACC
             73     ; MAXIMUM STACK DEPTH: 2
             74     ; SUBROUTINES CALLED: DCDKPD1 - Decode Keypad
             75     ; BRANCHING: None other than subroutine
             76     ; TEST CRITERIA: Test all functional aspects of this module with the EMV51
             77     ;                  Emulation Vehicle.
             78     ; ERROR EXITS: None
             79     ;
             80     ; MODULE LENGTH: __45H BYTES (69 DEC.)
             81     ; MODULE EXECUTION TIME: CRYSTAL FREQ. ___12.00___MHZ
             82     ;                         MINIMUM TIME; ___26.00___USEC
             83     ;                         TYPICAL TIME; ___26.00___USEC
             84     ;                         MAXIMUM TIME; ___45.00+___USEC + DCDKPD1
             85     ;
             86     ;                         MIN EXECUTION CYCLES__1AH__
             87     ;                         MAX EXECUTION CYCLES__2DH + DCDKPD1
             88     ;***********************************************************************
        89 +1      $EJ
             90     ;***********************************************************************
             91     NAME SERVICE_KEYPAD_DATA1
             92     S_K_D1 SEGMENT CODE
             93     RSEG S_K_D1
             94     EXTRN CODE (DCDKPD1)
             95     EXTRN BIT (KEY_SERVICED1)
             96     PUBLIC SRVKPD1,KEY_DEP1
             97     USING 2
             98     ;***********************************************************************
             99     ;            8051 SUBSET DATA MEMORY MAP
            100     ;=======================================================================
```

```
LOC  OBJ        LINE  SOURCE

101    ;                        BYTE
               102    ;    NAME                ADDRESS              MODULE(S) WHERE USED
               103    ;-------------------------------------------------------------------
0014           104         KEY_COL_DATA        DATA 14H    ;Bank 2, R4 ;Used in SRVKPD routine
REG            105         PASS_CNTR           SET R3
REG            106         INTGRTN_CNTR        SET R2      ;Bank 2, Register 12H
0011           107         KEY_ROW_POINTER     DATA 11H    ;Bank 2, R1
003D           108         KEY_RESP_REG        SET 3DH
002D           109         KEY_CMND_REG        SET 2DH     ;
               110    ;*******************************************************************
               111    ;                  8051 SUBSET DATA MEMORY MAP - CONT'D
               112    ;===================================================================
               113    ;
               114    ;    NAME                BIT
               115    ;                        ADDRESS              MODULE(S) WHERE USED
00F7           116         KEY_DEP1            BIT B.7
               117    ;*******************************************************************
               118 +1 $EJ
               119    SRVKPD1:
0000 D2D4      120         SETB RS1                        ;Select Bank 2
0002 C2D3      121         CLR  RS0                        ;Insure ONLY Bank 2 is selected
0004 BB0900    122         CJNE PASS_CNTR,#9H,$+3          ;Set-up for test of "C" Reg
0007 400B      123         JC   LOAD                       ;If PASS_CNTR<9, jump
0009 7B08      124         MOV  PASS_CNTR,#8H              ;If PASS_CNTR>9, set PASS_CNTR=8 because it is
               125                                         ; out of range, also reset the following
               126                                         ; parameters: NOTE-8 passes must be made, the
               127                                         ; 8th to set all "A" chip cmnd outputs to "1"
000B 752DFE    128         MOV  2DH,#11111110B
000E 7A01      129         MOV  R2,#01H
0010 C200   F  130         CLR  KEY_SERVICED1
0012 C2F7      131         CLR  KEY_DEP1
               132    LOAD:
0014 EB        133         MOV  A,PASS_CNTR                ;Test for even count in PASS_CNTR; skip decode
               134                                         ; if even
0015 13        135         RRC  A                          ;Least significant bit now in "C" register
0016 501F      136         JNC  DPC                        ;If even jump-if odd decode potential data
0018 E53D      137         MOV  A,KEY_RESP_REG
001A 440F      138         ORL  A,#0FH                     ;Set Lo Byte="1111"
001C B4FF00    139         CJNE A,#0FFH,$+3                ;Set-up for test of "C" Reg.
001F 5010      140         JNC  SHIFT_XMIT                 ;If A=FF, no key depressed - jump
0021 BA0104    141         CJNE INTGRTN_CNTR,#1D,K_D       ;Sample the data only when the count = 1
0024 F514      142         MOV  KEY_COL_DATA,A
0026 8B11      143         MOV  KEY_ROW_POINTER,PASS_CNTR
               144    K_D:
0028 B51406    145         CJNE A,KEY_COL_DATA,SHIFT_XMIT  ;If not same key INTGRTN_CNTR will be
               146                                         ; decremented in another routine
002B EB        147         MOV  A,PASS_CNTR
002C B51102    148         CJNE A,KEY_ROW_POINTER,SHIFT_XMIT ;If not same row, INTGRTN_CNTR will
               149                                         ; be decremented in another routine
002F D2F7      150         SETB KEY_DEP1                   ;Set Flag KEY_DEP1=1 only if the same key
               151                                         ; was depressed
               152    SHIFT_XMIT:
0031 E52D      153         MOV  A,KEY_CMND_REG             ;Rotate the bit pattern in K_C_R, 2 positions
               154                                         ; to the left and restore it. This prepares
0033 23        155         RL   A                          ; the byte to be sent to the "A" chip connected
0034 23        156         RL   A                          ; to the keypad to extinguish the drive to the
0035 F52D      157         MOV  KEY_CMND_REG,A             ; current row and set-up to drive the next row.
               158    DPC:
```

| LOC  OBJ | LINE | SOURCE | |
|---|---|---|---|
| 0037 D808 | 159 | DJNZ PASS_CNTR,CONT | ;In 8 passes store any key depression data in |
|  | 160 |  | ; R1, R4 and on 8th pass decode and start over |
| 0039 7B08 | 161 | MOV PASS_CNTR,#8H | ;Restore counter to 8 |
| 003B 752DFE | 162 | MOV KEY_CMND_REG,#11111110B | ;Restore starting Command Pattern |
| 003E 120000   F | 163 | CALL DCDKPD1 | ;Call DeCoDe KeyPaD subroutine |
|  | 164 | CONT: |  |
| 0041 C2D3 | 165 | CLR RS0 | ;Reset Bank Switch to Bank 0 |
| 0043 C2D4 | 166 | CLR RS1 |  |
| 0045 22 | 167 | RET |  |
|  | 168 | END |  |

XREF SYMBOL TABLE LISTING
---- ------ ----- -------

| N A M E | T Y P E | V A L U E |  | ATTRIBUTES AND REFERENCES |
|---|---|---|---|---|
| B. . . . . . . . . . | D ADDR | 30F0H | A | 116 |
| CONT. . . . . . . . | C ADDR | 0041H | R | SEG=S_K_D1  159 164# |
| DCDKPD1. . . . . . . | C ADDR | ---- | EXT | 94# 163 |
| DPC. . . . . . . . . | C ADDR | 0037H | R | SEG=S_K_D1  136 158# |
| INTGRTN_CNTR . . . . | REG | R2 |  | 106# 141 |
| K_D. . . . . . . . . | C ADDR | 0028H | R | SEG=S_K_D1  141 144# |
| KEY_CMND_REG . . . . | NUMB | 002DH | A | 109# 153 157 162 |
| KEY_COL_DATA . . . . | D ADDR | 0014H | A | 104# 142 145 |
| KEY_DEP1 . . . . . . | B ADDR | 00F0H.7 | A PUB | 96 116# 131 150 |
| KEY_RESP_REG . . . . | NUMB | 003DH | A | 108# 137 |
| KEY_ROW_POINTER. . . | D ADDR | 0011H | A | 107# 143 148 |
| KEY_SERVICED1. . . . | B ADDR | ---- | EXT | 95# 130 |
| LOAD . . . . . . . . | C ADDR | 0014H | R | SEG=S_K_D1  123 132# |
| PASS_CNTR. . . . . . | REG | R3 |  | 105# 122 124 133 143 147 159 161 |
| RS0. . . . . . . . . | B ADDR | 00D0H.3 | A | 121 165 |
| RS1. . . . . . . . . | B ADDR | 00D0H.4 | A | 120 166 |
| S_K_D1 . . . . . . . | C SEG | 0046H |  | REL=UNIT 92# 93 |
| SERVICE_KEYPAD_DATA1 | ---- | ---- |  | 91 |
| SHIFT_XMIT . . . . . | C ADDR | 0031H | R | SEG=S_K_D1  140 145 148 152# |
| SRVKPD1. . . . . . . | C ADDR | 0000H | R PUB | SEG=S_K_D1  96 119# |

REGISTER BANK(S) USED: 0 2, TARGET MACHINE(S): 8051

ASSEMBLY COMPLETE, NO ERRORS FOUND

ISIS-II MCS-51 MACRO ASSEMBLER V2.0
OBJECT MODULE PLACED IN :F0:TSDK10.OBJ
ASSEMBLER INVOKED BY: ASM51 TSDK10.SRC XREF PW(108) TT(TSDK10-) DA() DB EP WF(:F1:) PR(:F1:TSDK10.LST)

| LOC  OBJ | LINE | SOURCE |
|---|---|---|
|  | 1 | $TT(TSDK10 - Task System Decode Keypad 1 V1.0) |
|  | 2 | ;************************************************************************ |
|  | 3 | ; ASSUMPTIONS: 1-This routine is part of the software to run the TASK Marketing |
|  | 4 | ;               Demo Board. The main executive is called TMMEP1 - Task |
|  | 5 | ;               Marketing Main Executive Program V1.0 and services 16 |
|  | 6 | ;               "A" chips. |
|  | 7 | ;            2-The routine PTSRK1 has already been executed. Thus the flag |
|  | 8 | ;               KEY_DEP1 has been serviced. This flag indicates whether any |

| LOC OBJ | LINE | SOURCE |
|---|---|---|
| | 9 | ; keys have been detected as being depressed in another routine. |
| | 10 | ; 3-The TMTRN0 routine has previously transmitted data information |
| | 11 | ; to and from the "A" chip to which the keypad is attached. |
| | 12 | ; 4-It takes approximately 4 milliseconds to service the keypad. |
| | 13 | ; This represents 8 complete cycles of the TASK system. |
| | 14 | ; 5-Keypad debouncing is accomplished by starting an up-counter |
| | 15 | ; whenever a valid key depression is observed. That up-count |
| | 16 | ; proceeds to 20 unless the key is no longer depressed. That |
| | 17 | ; would result from spurious noise or contact bouncing. When- |
| | 18 | ; ever that occurs, the counter decrements until the same key |
| | 19 | ; depression is observed. When and if the count eventually |
| | 20 | ; reaches 20, the key is decoded. This technique amounts to |
| | 21 | ; an intergation of contact closure with time and results in the |
| | 22 | ; best possible debouncing in a noisy environment. |
| | 23 | ; 6-This routine uses Register Bank 2 exclusively. |
| | 24 | ; 7-This routine is a subroutine conditionally called by the |
| | 25 | ; routine PTSRK1. It is called on every 8th pass of the system |
| | 26 | ; and is always executed no mater whether any key is depressed |
| | 27 | ; continuously or not depressed at all. |
| | 28 | ; 8-When a key is finally decoded, the flag KEY_SERVICED1 is |
| | 29 | ; set = "1". |
| | 30 | ; 9-The decoded key value is placed into the accumulator at the |
| | 31 | ; time that a return from this routine is executed. |
| | 32 | ; LIMITATIONS: 1-An up-count of 20 requires a total of 160 consecutive passes |
| | 33 | ; of the system with the same key depressed (no noise or |
| | 34 | ; contact bounce). Thus at least 80 milliseconds is required |
| | 35 | ; to properly decode a key depression. |
| | 36 | ; RESTRICTIONS: 1-The flag KEY_DEP1 is always reset to "0" in this routine. |
| | 37 | ; ACCURACY REQUIREMENTS: 1-The system requires a 12 MHz clock oscillator and |
| | 38 | ; services 16 "A" chips. Thus 1 complete system |
| | 39 | ; cycle requires 202 usec (data transmission time to |
| | 40 | ; 16 "A" chips) + 300 usec (processing time) =502 usec |
| | 41 | ; or approximately 1/2 millisecond. |
| | 42 | ; METHODS USED: 1-Determine if the same key has been depressed from the |
| | 43 | ; previous key service cycle (8 passes of the system). The |
| | 44 | ; byte, INTGRTN_CNTR, is incremented on each pass of the key |
| | 45 | ; service cycle as long as the same key is sensed as being |
| | 46 | ; depressed; otherwise the counter is decremented. |
| | 47 | ; 2-When the same key has been depressed for 20 key service |
| | 48 | ; cycles, decode the key. |
| | 49 | ; 3-Decoding is accomplished by calculating the key number from |
| | 50 | ; the row and column data and jumping to a look-up table. |
| | 51 | ; ALGORITHM DEFINITIONS: 1-Key calculation is accomplished as follows: |
| | 52 | ; A-Divide the KEY_ROW_POINTER by 2; new range:0-3 |
| | 53 | ; B-Multiply the result by 9. |
| | 54 | ; C-Add the KEY_COL_DATA to the result after altering. |
| | 55 | ; D-Key Index = 9 X Row + Column. |
| | 56 | ; E-Obtain key code from Table. Note: a "0H" is always |
| | 57 | ; returned for invalid data in the register used for |
| | 58 | ; the look-up. |
| | 59 | ; PRE-REQUISITES: 1-COLD_START_INITIALIZATION in the Main Executive Program |
| | 60 | ; must initialize the following: PASS_CNTR, INTGRTN_CNTR, |
| | 61 | ; KEY_SERVICED1, and KEY_DECODED_NOT. |
| | 62 | ; 2-The routine PTSRK1 must have already been executed. This |
| | 63 | ; routine sets the flag KEY_DEP1 |
| | 64 | ; INPUTS: |
| | 65 | ; -I/O; None |
| | 66 | ; -REGISTERS; TBL_INDEX_POINTER(R5,Bnk2-15H) |

```
LOC OBJ        LINE   SOURCE
               67     ;   -MAILBOXES; None
               68     ;   -FLAGS; None
               69     ;   -OTHER MODULES:
               70     ;     -I/O; None
               71     ;     -REGISTERS; None
               72     ;     -MAILBOXES; None
               73     ;     -FLAGS; None
               74     ;   -OTHER SUBROUTINES:
               75     ;     -I/O; None
               76     ;     -REGISTERS; KEY_ROW_POINTER(R1,Bnk2-11H)-PTSRK1, INTGRTN_CNTR(R2,Bnk2-
               77     ;                 12H)-PTSRK1, KEY_COL_DATA(R4,Bnk2-14H)
               78     ;     -MAILBOXES; None
               79     ;     -FLAGS; KEY_DEP1(BH.7-F7H)-PTSRK1, KEY_SERVICED1(BH.2-F2H)-PTSRK1
               80     ; OUTPUTS:
               81     ;   -I/O; None
               82     ;   -REGISTERS; TBL_INDEX_POINTER(R5,Bnk2-15H)
               83     ;   -MAILBOXES; None
               84     ;   -FLAGS; KEY_DECODED_NOT(20H.0)
               85     ;   -OTHER MODULES:
               86     ;     -I/O; None
               87     ;     -REGISTERS; None
               88     ;     -MAILBOXES; None
               89     ;     -FLAGS; None
               90     ;   -OTHER SUBROUTINES:
               91     ;     -I/O; None
               92     ;     -REGISTERS; INTGRTN_CNTR(R2,Bnk2-12H)-PTSRK1, PASS_CNTR(R3,Bnk2-13H)-PTSRK1
               93     ;     -MAILBOXES; ACCumulator
               94     ;     -FLAGS; KEY_DEP1(BH.7-F7H)-PTSRK1, KEY_SERVICED1(BH.2-F2H)-PTSRK1
               95     ; REGISTERS USED: ACC, R5, R4, R3, R2, R1 (All Registers use Bank 2)
               96     ; MAXIMUM STACK DEPTH: 0
               97     ; OUTSIDE SUBROUTINES CALLED: None
               98     ; BRANCHING: None
               99     ; EXTERNAL LABELS: KEY_DEP1, DCDKPD1, KEY_SERVICED1, KEY_DECODED_NOT
              100     ; TEST CRITERIA: Test all functional aspects of this module with the EMV51
              101     ;                Emulation Vehicle
              102     ; INTERMODULE COMMUNICATION: None
              103     ; ERROR EXITS:
              104     ;   TYPE; Register Test - KEY_ROW_POINTER must be in the range of 0 to 8
              105     ;   PROCEDURE; If out of range, a byte is set(PASS_CNTR) to another out
              106     ;              of range value, and in the PTSRK1 routine all pertinent
              107     ;              parameters are reset to initial values. This routine then
              108     ;              ends with a RETURN.
              109     ;
              110     ; MODULE LENGTH: __63H __99Dec BYTES
              111     ; MODULE EXECUTION TIME:
              112     ;     CRYSTAL FREQ. ____12.00____MHZ
              113     ;     MINIMUM TIME; ____8.00____USEC
              114     ;     TYPICAL TIME; ____8.00____USEC
              115     ;     MAXIMUM TIME; ____38.00____USEC
              116     ;
              117     ;     MIN EXECUTION CYCLES; ___8H ____8Dec
              118     ;     TYP EXECUTION CYCLES; ___8H ____8Dec
              119     ;     MAX EXECUTION CYCLES; __26H ____38Dec
              120     ;
              121     ;++++++++++++++++++++++++++++++++++++++++++++++++++++++++++++++++++++++
              122 +1  $EJ
```

```
LOC  OBJ              LINE   SOURCE

126    ;               of range value, and in the PTSRK1 routine all pertinent
                      127    ;               parameters are reset to initial values. This routine then
                      128    ;               ends with a RETURN.
                      129    ;
                      130    ; MODULE LENGTH: __63H __99Dec BYTES
                      131    ; MODULE EXECUTION TIME:
                      112    ;       CRYSTAL FREQ. ___12.00___MHZ
                      113    ;       MINIMUM TIME; ____8.00___USEC
                      114    ;       TYPICAL TIME; ____8.00___USEC
                      115    ;       MAXIMUM TIME; ___38.00___USEC
                      116    ;
                      117    ;       MIN EXECUTION CYCLES; __8H ____8Dec
                      118    ;       TYP EXECUTION CYCLES; __8H ____8Dec
                      119    ;       MAX EXECUTION CYCLES; _26H ___38Dec
                      120    ;
                      121    ;*******************************************************************
                    122 +1   $EJ
                      123    NAME DECODE_KEYPAD1
                      124    D_K1 SEGMENT CODE
                      125    RSEG D_K1
                      126    EXTRN BIT (KEY_DEP1)
                      127    PUBLIC DCDKPD1,KEY_SERVICED1,KEY_DECODED_NOT
                      128    USING 2
                      129    ;*******************************************************************
                      130    ;                      8051 SUBSET DATA MEMORY MAP
                      131    ;===================================================================
                      132    ;                              BYTE
                      133    ;       NAME                   ADDRESS         MODULE(S) WHERE USED
                      134    ;-------------------------------------------------------------------
REG                   135    TBL_INDEX_POINTER              SET R5          ;Bank 2
REG                   136    KEY_COL_DATA                   SET R4          ;Bank 2
REG                   137    PASS_CNTR                      SET R3          ;Bank 2
REG                   138    INTGRTN_CNTR                   SET R2          ;Bank 2, Register 12H
REG                   139    KEY_ROW_POINTER                SET R1          ;Bank 2
                      140    ;*******************************************************************
                      141    ;                 8051 SUBSET DATA MEMORY MAP - CONT'D
                      142    ;===================================================================
                      143    ;                              BIT
                      144    ;       NAME                   ADDRESS         MODULE(S) WHERE USED
                      145    ;-------------------------------------------------------------------
00F2                  146    KEY_SERVICED1                  BIT B.2  ;F2H
0020                  147    KEY_DECODED_NOT                BIT 20H.0
                      148    ;*******************************************************************
                    149 +1   $EJ
                      150    DCDKPD1:
0000 D2D4             151            SETB RS1                ;Be sure Bank Switch is set to "2"
0002 C2D3             152            CLR  RS0
0004 30002A    F      153            JNB  KEY_DEP1,NO_KEY    ;If key depressed fall thru!
0007 C200      F      154            CLR  KEY_DEP1           ;Set Flag KEY_DEP1=0
0009 0A               155            INC  INTGRTN_CNTR       ;Add 1 to INTGRTN_CNTR
000A 20F224           156            JB   KEY_SERVICED1,NO_KEY
000D BA1400           157            CJNE INTGRTN_CNTR,#20D,$+3  ;Set-up for next instruction
0010 5001             158            JNC  $+3                ;If INTGRTN_CNTR is (20 (80 msec), return
0012 22               159            RET
                      160    ;-------------------------------------------------------------------
                      161    DECODE_KEY:
0013 7A05             162            MOV  INTGRTN_CNTR,#05D  ;This guarantees that the key will only be
                      163                                    ; serviced one time, even if continuously
                      164                                    ; depressed.
```

```
LOC  OBJ         LINE   SOURCE

0015 B90908      165           CJNE KEY_ROW_POINTER,#09H,$+3  ;Verify 0<R1<9H: If R1>9H, C=0
0018 5020        166           JNC  RESET1                     ;If R1>9, Jump to Reset1
001A E9          167           MOV  A,KEY_ROW_POINTER          ;ACC=pointer which is proportional to the row
                 168                                           ;  activated.
001B C3          169           CLR  C                          ;Prepare for the next RRC
001C 13          170           RRC  A                          ;Divide ACC by 2
001D FD          171           MOV  TBL_INDEX_POINTER,A        ;Temp Store actual Row # in TBL_INDEX_POINTER.
001E C4          172           SWAP A                          ;Multiply by 16
001F 03          173           RR   A                          ;Divide by 2-net is X8
0020 2D          174           ADD  A,TBL_INDEX_POINTER        ;Total Multiply now =9 in ACC
0021 FD          175           MOV  TBL_INDEX_POINTER,A        ;Temp Store Row times 9 in TBL_INDEX_POINTER
0022 EC          176           MOV  A,KEY_COL_DATA             ;Load key data from register 4
0023 F4          177           CPL  A                          ;K_C_D from the "A" chip is normally inverted
                 178                                           ; and occupies the high nibble of the byte
0024 C4          179           SWAP A
0025 540F        180           ANL  A,#0FH                     ;Mask off high nibble
0027 2D          181           ADD  A,TBL_INDEX_POINTER        ;ACC=(9 x Row)+Key position [1 to 4]
0028 900000   F  182           MOV  DPTR,#TABLE_DECODE1
002B 93          183           MOVC A,@A+DPTR                  ;Get key value (1 to F) from table
002C D2F2        184           SETB KEY_SERVICED1              ;Set flag - passed 1 time
002E C200        185           CLR  KEY_DECODED_NOT            ;NH, L=Key decoded
0030 22          186           RET
                 187    ;----------------------------
                 188    NO_KEY:
0031 DA06        189           DJNZ INTGRTN_CNTR,RTRN          ;If CNTR >0, then Return
0033 7A01        190           MOV  INTGRTN_CNTR,#1H           ;Set CNTR =1
0035 D200        191           SETB KEY_DECODED_NOT            ;NH, L=Key decoded
0037 C2F2        192           CLR  KEY_SERVICED1
0039 22          193    RTRN:  RET
                 194    ;----------------------------
                 195    RESET1:
003A 7B7F        196           MOV  PASS_CNTR,#7FH             ;Force a Reset of parameters on next pass
003C D200        197           SETB KEY_DECODED_NOT            ;NH, L=Key decoded
003E 22          198           RET
                 199    ;============================
                 200    TABLE_DECODE1:                          ;Table is backward-value is calculated
003F 00          201           DB 00H                          ;4th Row - no key
0040 0E          202           DB 0EH                          ;1st Key-E for * Key
0041 00          203           DB 00H                          ;2nd Key-0 for OPER Key
0042 00          204           DB 00H                          ;No value
0043 0F          205           DB 0FH                          ;3rd Key-F for # Key
0044 00          206           DB 0,0,0                        ;No Value
0045 00
0046 00
0047 04          207           DB 04H                          ;4th Key-4
                 208    TABLE_ROW_3:
0048 00          209           DB 00H                          ;No Key
0049 07          210           DB 07H                          ;1st Key-7
004A 08          211           DB 08H                          ;2nd Key-8
004B 00          212           DB 00H                          ;No value
004C 09          213           DB 09H                          ;3rd Key-9
004D 00          214           DB 0,0,0                        ;No Value
004E 00
004F 00
0050 03          215           DB 03H                          ;4th Key-3
                 216    TABLE_ROW_2:
0051 00          217           DB 00H                          ;No Key
0052 04          218           DB 04H                          ;1st Key-4
```

```
LOC  OBJ         LINE    SOURCE 0053 05          219         DB 05H              ;2nd Key-5
0054 00          220         DB 00H              ;No value
0055 06          221         DB 06H              ;3rd Key-6
0056 00          222         DB 0,0,0            ;No Value
0057 00
0058 00
0059 02          223         DB 02H              ;4th Key-2
                 224     TABLE_ROW_1:
005A 00          225         DB 00H              ;No Key
005B 01          226         DB 01H              ;1st Key-1
005C 02          227         DB 02H              ;2nd Key-2
005D 00          228         DB 00H              ;No value
005E 03          229         DB 03H              ;3rd Key-3
005F 00          230         DB 0,0,0            ;No Value
0060 00
0061 00
0062 01          231         DB 01H              ;4th Key-1
                 232     END
```

XREF SYMBOL TABLE LISTING

```
N A M E           T Y P E    V A L U E    ATTRIBUTES AND REFERENCES

B . . . . . . . . D ADDR    00F0H    A        146
D_K1. . . . . . . C SEG     0063H             REL=UNIT  124# 125
DCDKPD1 . . . . . C ADDR    0000H    R PUB    SEG=D_K1  127 150#
DECODE_KEY. . . . C ADDR    0013H    R        SEG=D_K1  161#
DECODE_KEYPAD1. .    --        --             123
INTGRTN_CNTR. . .   REG      R2               128# 155 157 162 189 198
KEY_COL_DATA. . .   REG      R4               136# 176
KEY_DECODED_NOT .  B ADDR    0020H.0  A PUB   127 147# 185 191 197
KEY_DEP1. . . . .  B ADDR    --       EXT    126# 153 154
KEY_ROW_POINTER .   REG      R1               139# 165 167
KEY_SERVICED1 . .  B ADDR    00F0H.2  A PUB   127 146# 156 184 192
NO_KEY. . . . . . C ADDR    0031H    R        SEG=D_K1  153 156 188#
PASS_CNTR . . . .   REG      R3               137# 196
RESET1. . . . . . C ADDR    003AH    R        SEG=D_K1  166 195#
RS0 . . . . . . .  B ADDR    00D0H.3  A        152
RS1 . . . . . . .  B ADDR    00D0H.4  A        151
RTRN. . . . . . . C ADDR    0039H    R        SEG=D_K1  189 193#
TABLE_DECODE1 . . C ADDR    003FH    R        SEG=D_K1  182 200#
TABLE_ROW_1 . . . C ADDR    005AH    R        SEG=D_K1  224#
TABLE_ROW_2 . . . C ADDR    0051H    R        SEG=D_K1  216#
TABLE_ROW_3 . . . C ADDR    0048H    R        SEG=D_K1  208#
TBL_INDEX_POINTER   REG     R5                135# 171 174 175 181
```

REGISTER BANK(S) USED: 0 2, TARGET MACHINE(S): 8051

ASSEMBLY COMPLETE, NO ERRORS FOUND

I claim:

1. In a multiplex system of the type which comprises a master controller, a set of data channels, and a plurality of remote stations, each comprising means for transmitting a plurality of data bits to the controller via said set of data channels and means for receiving a plurality of data bits from the controller via said set of data channels, the improvement comprising:

a microcomputer included in the controller and interconnected to the set of data channels, said microcomputer comprising a CPU and an interface buffer;

first means, included in the interface buffer, for sequentially passing a plurality of first sets of data bits, each of the first sets of data bits being passed in a first direction between the microcomputer and a respective one of the remote stations via the set of data channels, said first means operating independently of the CPU during the passing of each set of data bits;

second means, included in the CPU and operative during operation of the first means, for sequentially passing a respective second set of data bits in a second direction between the microcomputer and each of the remote stations via the set of data channels;

each of said first sets of data bits comprising a plurality of first data bits;

each of said second sets of data bits comprising a plurality of second data bits;

each first and second sets of data bits overlapping in time without interfering with one another such that the first and second means operate simultaneously.

2. The invention of claim 1 wherein the first data bits comprise command bits transmitted from the master controller to the remote stations, and wherein the second data bits comprise response bits transmitted from the remote stations to the master controller.

3. The invention of claim 1 wherein the interface buffer comprises a UART.

4. The invention of claim 1 wherein the set of data channels comprises a single conductor and wherein the data bits are all transmitted to and from the master controller via the single conductor.

5. The invention of claim 2 wherein the set of data channels comprises a single conductor and wherein the command bits and the response bits are transmitted to and from the master controller via the single conductor.

6. The invention of claim 1 wherein the first and second data bits alternate in time.

7. In a multiplex system of the type which comprises a master controller, a data channel, and a plurality of remote stations, each comprising means for transmitting a plurality of response bits to the controller via the data channel and means for receiving a plurality of command bits from the controller via the data channel, the improvement comprising:

a microcomputer included in the controller, said microcomputer comprising a CPU interconnected to the data channel and a transmit buffer interconnected to the data channel;

means, included in the transmit buffer, for sequentially transmitting a selected respective command byte to each of the remote stations via the data channel, each of the command bytes comprising a plurality of the command bits and a plurality of spacer bits, said transmitting means operating independently of the CPU during transmission of each command byte; and means, included in the CPU, for reading and storing the response bits received via the data channel, each during transmission of a respective one of the spacer bits, such that the reading and storing means operate simultaneously with the transmitting means.

8. The invention of claim 7 wherein the transmit buffer comprises a UART included as an integral part of the microcomputer.

9. The invention of claim 7 wherein the data channel comprises a single conductor, and wherein the response bits and the data bits are transmitted between the master controller and the remote stations via the single conductor.

10. The invention of claim 7 wherein each pair of adjacent command bits in each command byte is separated by a respective spacer bit such that the response bits alternate in time with the command bits.

11. The invention of claim 7 wherein the command bits of each command byte are interleaved in time with the response bits of the respective response byte.

12. A multiplex system comprising:

a master controller;

a plurality of remote stations connected to the master controller by a cable, said plurality of remote stations including a first remote station;

means for transmitting sets of clock signals from the master controller to the remote stations;

means for transmitting command bytes from the controller to the remote stations, each command byte comprising a plurality of command bits transmitted during time periods associated with respective ones of the clock signals;

means in each remote station for maintaining a count of the clock signals and for enabling the remote station for a selected time period at a respective value of the count;

means in each remote station for receiving the respective command byte while the remote station is enabled;

means in each remote station for transmitting response bytes from the remote station to the controller while the respective remote station is enabled, each response byte comprising a plurality of response bits;

a keyboard having a plurality of row conductors, a plurality of column conductors, and an array of switches, each placed to interconnect a respective row conductor with a respective column conductor when activated;

means, included in the first remote station, for applying a plurality of signal patterns to the row conductors, said signal patterns determined by a first set of the command bytes received by the first remote station;

means, included in the first remote station, for generating a first set of the response bytes such that each of the response bytes in the first set of response bytes indicates a signal pattern on the column conductors at a respective time; and means, included in the master controller, for generating the first set of command bytes such that the signal patterns applied to the row conductors scan the row conductors sequentially.

13. The invention of claim 12, wherein each of the command bytes causes a respective one of the row conductors to be grounded while the remaining row conductors are held at a selected voltage.

14. The invention of claim 12 wherein the means for applying a plurality of signal patterns to the row conductors comprises a plurality of latches, each adapted to store a respective one of the command bits included in each of the command bytes included in the first set of command bytes.

15. The invention of claim 12 wherein the command bits of each command byte are interleaved in time with the response bits of the respective response byte.

16. In a multiplex system of the type comprising a central controller which monitors a repeatedly polled response signal generated by a remote station, the improvement comprising:
means for maintaining a count;
means for automatically incrementing the count by an increment each time the polled response signal is in a first state;
means for automatically decrementing the count by a decrement each time the polled response signal is in a second state;
means for determining when the polled response signal is in a selected one of the first and second states, said determining means comprising means for comparing the count with a threshold value and for indicating when the count passes the threshold value; and
means for decreasing the count by an amount greater than the decrement of the decrementing means to a value less than the threshold value after the count passes the threshold value.

17. The invention of claim 16 wherein the incrementing means increments the count by a first selected amount; wherein the decrementing means decrements the count by a second selected amount; and wherein the first selected amount is equal to the second selected amount.

18. In a multiplex system of the type comprising a central controller; a plurality of response stations interconnected to the central controller by a cable; means, included in a first one of the remote stations, for generating a response signal; and means, included in the master controller, for repeatedly polling the response signal to determine a set of response signal values; the improvement comprising:
an integration counter included in the master controller, said integration counter operative to store a count;
means for incrementing the count by an increment each time the response signal value is in a logic low state;
means for decrementing the count by a decrement each time the response signal value is in a logic high state;
means for comparing the count with a threshold value;
means for classifying the polled response signal as in the logic low state when the comparing means indicates that the count is greater than or equal to the threshold value;
means for decreasing the count to an intermediate value which is less than the threshold value by an amount greater than the decrement of the decrementing means when the classifying means classifies the polled response signal as in the logic low state; and
means for indicating that the polled response signal has been classified by the classifying means when the count reaches a reset value, less than the intermediate value.

19. The invention of claim 18 wherein the decrementing means decrements the count by a selected amount, and wherein the incrementing means increments the count by the same amount.

* * * * *

UNITED STATES PATENT OFFICE
CERTIFICATE OF CORRECTION

Patent No. 4,833,672  Dated May 23, 1989

Inventor(s) Lee Walter Steely

It is certified that error appears in the above-identified patent and that said Letters Patent is hereby corrected as shown below:

In claim 1, column 59, line 31, the word "each" should be --said--.

Signed and Sealed this

Nineteenth Day of November, 1991

Attest:

HARRY F. MANBECK, JR.

*Attesting Officer*  *Commissioner of Patents and Trademarks*